United States Patent
Kim et al.

(10) Patent No.: US 11,950,383 B2
(45) Date of Patent: Apr. 2, 2024

(54) DISPLAY APPARATUS

(71) Applicant: SAMSUNG ELECTRONICS CO., LTD., Suwon-si (KR)

(72) Inventors: Hee-Bong Kim, Suwon-si (KR); Dong Wook Kim, Suwon-si (KR); Ji-Gwang Kim, Suwon-si (KR); Tae-Hun Kim, Suwon-si (KR); Yong Gu Do, Suwon-si (KR); Jeong Woo Park, Suwon-si (KR); Gil Jae Lee, Suwon-si (KR); Sang Young Lee, Suwon-si (KR); Pil Kwon Jung, Suwon-si (KR); Su-An Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 474 days.

(21) Appl. No.: 17/272,485

(22) PCT Filed: Aug. 27, 2019

(86) PCT No.: PCT/KR2019/010940
§ 371 (c)(1),
(2) Date: Mar. 1, 2021

(87) PCT Pub. No.: WO2020/045957
PCT Pub. Date: Mar. 5, 2020

(65) Prior Publication Data
US 2021/0329802 A1    Oct. 21, 2021

(30) Foreign Application Priority Data
Aug. 30, 2018  (KR) ........................ 10-2018-0102395

(51) Int. Cl.
*H05K 5/02*      (2006.01)
*G02F 1/1333*    (2006.01)

(52) U.S. Cl.
CPC ..... *H05K 5/0234* (2013.01); *G02F 1/133314* (2021.01); *G02F 1/13332* (2021.01); *H05K 5/0204* (2013.01)

(58) Field of Classification Search
CPC ................ H05K 5/0234; H05K 5/0204; G02F 1/133314; G02F 1/13332
(Continued)

(56) References Cited

U.S. PATENT DOCUMENTS

| 8,400,767 B2 * | 3/2013 | Yeom ................... F16M 13/005 361/679.55 |
| 2004/0047115 A1 | 3/2004 | Helot et al. |

(Continued)

FOREIGN PATENT DOCUMENTS

| KR | 10-2001-0053803 | 7/2001 |
| KR | 10-2014-0123806 | 10/2014 |

(Continued)

OTHER PUBLICATIONS

Partial Supplementary European Search Report dated Aug. 18, 2021 in European Patent Application No. 19856014.6-1203.

(Continued)

*Primary Examiner* — Binh B Tran
(74) *Attorney, Agent, or Firm* — STAAS & HALSEY LLP

(57) ABSTRACT

A display apparatus according to a concept of the disclosure includes: a display panel configured to display an image in a front direction; a top chassis positioned in a front direction of the display panel; a bottom chassis positioned in a rear direction of the display panel; a rear cover covering a rear side of the bottom chassis; and a stand member being accommodatable in the rear cover and selectively coupled with a rear surface of the rear cover, wherein the rear cover includes an accommodating portion in which the stand (Continued)

member is accommodated and a coupling portion coupled with the stand member, and the stand member includes an inserting protrusion which is inserted into the accommodating portion and the coupling portion.

14 Claims, 34 Drawing Sheets

(58) Field of Classification Search
    USPC .......................................................... 361/807
    See application file for complete search history.

(56) References Cited

U.S. PATENT DOCUMENTS

| | | | |
|---|---|---|---|
| 2010/0142175 A1* | 6/2010 | Cheng | H04M 1/04 248/125.7 |
| 2010/0159997 A1 | 6/2010 | Wang | |
| 2011/0037909 A1* | 2/2011 | Sung | H04N 5/64 348/836 |
| 2012/0320514 A1 | 12/2012 | Franz et al. | |
| 2016/0143160 A1 | 5/2016 | Huang et al. | |

FOREIGN PATENT DOCUMENTS

| | | |
|---|---|---|
| KR | 10-2018-0074543 | 7/2018 |
| WO | 10-2018-0074543 A | 7/2018 |

OTHER PUBLICATIONS

Korean Office Action dated Sep. 28, 2022 in Korean Patent Application No. 10-2018-0102395 (7 pages; 9 pages English translation).
Korean Notice of Allowance dated Dec. 8, 2022 in Korean Patent Application No. 10-2018-0102395 (7 pages; 1 page English translation).
International Search Report dated Dec. 26, 2019 in International Patent Application No. PCT/KR2019/010940.
European Search Report for European Patent Application No. 19856014.6 dated Nov. 22, 2022.
Office Action dated Oct. 26, 2023 in European Patent Application No. 19 856 014.6.

* cited by examiner

DISPLAY APPARATUS

CROSS-REFERENCE TO RELATED APPLICATION

This application claims priority to and the benefit of Korean Patent Application No. 10-2018-0102395, filed on Aug. 30, 2018 in the Korean Intellectual Property Office, and PCT Application No. PCT-KR2019-010940, filed on Aug. 27, 2019, in the Korean Intellectual Property Office, the disclosures of which are incorporated by reference in their entirety.

BACKGROUND

1. Field

The disclosure relates to a display apparatus, and more particularly, to a display apparatus including a stand member.

2. Description of the Related Art

In general, a display apparatus is an apparatus for displaying a screen. Examples of the display apparatus include a monitor and a television. The display apparatus uses a self-emissive display panel such as Organic Light Emitting Diode (OLED) or a non-emissive display panel such as a Liquid Crystal Display (LCD) panel.

The disclosure relates to a display module and a display apparatus to which a non-emissive display panel is applied. The display apparatus to which the non-emissive display panel is applied is configured with a display panel being a LCD panel on which a screen is displayed and a backlight unit for supplying light to the display panel, wherein the backlight unit includes a light source module having a light source and a plurality of optical sheets receiving light from the light source to guide the light to the display panel.

Recent display apparatuses can be mounted on the wall or stand on the floor by a stand, according to a user's preference.

SUMMARY

Therefore, it is an aspect of the disclosure to provide a display apparatus with an improved structure for selectively accommodating a stand for holding the display apparatus.

It is another aspect of the disclosure to provide a display apparatus having a stand not exposed to outside in the case in which the display apparatus is mounted on a wall.

Additional aspects of the disclosure will be set forth in part in the description which follows and, in part, will be obvious from the description, or may be learned by practice of the disclosure.

In accordance with a concept of the disclosure, a display apparatus includes: a display panel configured to display an image in a front direction; a top chassis positioned in a front direction of the display panel; a bottom chassis positioned in a rear direction of the display panel; a rear cover covering a rear side of the bottom chassis; a stand member being accommodatable on the rear cover and selectively coupled with a rear surface of the rear cover, wherein the rear cover includes an accommodating portion in which the stand member is accommodated and a coupling portion which is coupled with the stand member, and the stand member includes an inserting protrusion which is inserted into the accommodating portion and the coupling portion.

Also, the inserting protrusion may be inserted into the accommodating portion in an up-down direction and into the coupling portion in a front-back direction.

Also, the inserting protrusion may include: a body portion which is inserted into the accommodating portion or the coupling portion; a support portion formed at one portion of the body portion and supporting at least one portion of the coupling portion upon insertion of the body portion into the coupling portion; and a hook extending in the up-down direction from one end of the support portion upon insertion of the body portion into the coupling portion.

Also, the inserting protrusion may further include a screw hole formed in the body portion and screw-coupled with the accommodating portion upon insertion of the body portion into the accommodating portion.

Also, the stand member may include a coupling area in which the inserting protrusion is formed and which contacts the rear cover upon coupling of the stand member with the coupling portion, a support area supporting the display apparatus upon coupling of the stand member with the coupling portion, and a connection area connecting the coupling area to the support area, and the coupling area may be orthogonal to the support area.

Also, the connection area may extend from the support area to be inclined at a preset angle with respect to the support area.

Also, the coupling area may further include a screw coupling hole through which the stand member is additionally screw-coupled with the rear cover upon coupling of the stand member with the coupling portion.

Also, the accommodating portion may include an accommodating groove having a shape corresponding to the stand member to accommodate the stand member.

Also, a width in up-down direction of the accommodating portion may be greater than a width in up-down direction of the stand member such that the stand member is movable in the up-down direction inside the accommodating groove.

Also, the accommodating portion may further include an inserting groove into which the inserting protrusion is inserted and which is concave in the up-down direction.

Also, the coupling portion may include a plurality of stand coupling grooves into which the inserting protrusion is inserted, and the plurality of stand coupling grooves may be spaced in the up-down direction to enable the inserting protrusion to be inserted into one of the plurality of stand coupling grooves selectively in the up-down direction.

Also, the stand member may be provided as a pair of stand members respectively positioned adjacent to left and right edges of the display apparatus, the display apparatus may further include a connection member connecting the pair of stand members to each other, and each of the pair of stand members may include a support portion including a supplementary coupling portion coupled with the connection member.

Also, the display apparatus may further include an electronic component configured to control the display panel, wherein the rear cover may further include a cable guide being in a shape of a groove extending in a left-right direction to guide a location of a cable for transferring a signal to the electronic component from outside, and the accommodating portion may be formed at an end of the cable guide.

Also, the coupling portion may be positioned at a lower end of the rear cover, and the inserting protrusion may be inserted into the coupling portion in the up-down direction.

Also, the accommodating portion and the coupling portion may be positioned at a rear end of the rear cover, and a position of the stand member accommodated in the accommodating portion may be orthogonal to a position of the stand member coupled with the coupling portion.

In accordance with a concept of the disclosure, a display apparatus includes: a display panel configured to display an image in a front direction; a top chassis positioned in a front direction of the display panel; a bottom chassis positioned in a rear direction of the display panel; a rear cover covering a rear side of the bottom chassis; a stand member being accommodatable on the rear cover and selectively coupled with a rear surface of the rear cover, wherein the rear cover includes an accommodating portion in which the stand member is accommodated and a coupling portion which is coupled with the stand member, and the coupling portion is positioned at a lower end of the rear cover.

Also, the display apparatus may further include an electronic component configured to control the display panel, wherein the rear cover may further include a cable guide being in a shape of a groove extending in a left-right direction to guide a location of a cable for transferring a signal to the electronic component from outside, and the accommodating portion may be formed at an end of the cable guide.

Also, the coupling portion may include a plurality of stand coupling grooves which are screw-coupled with the stand member, and the plurality of stand coupling grooves may include a first stand coupling groove and a second stand coupling groove aligned in the left-right direction, and a third stand coupling groove positioned in a diagonal direction with respect to the second stand coupling groove.

Also, the stand member may include an inserting protrusion which is inserted into the coupling portion and a support portion supporting the display apparatus upon insertion of the inserting protrusion into the coupling portion, wherein the inserting protrusion is orthogonal to the support portion.

In accordance with a concept of the disclosure, a display apparatus includes: a display panel configured to display an image in a front direction; a top chassis positioned in a front direction of the display panel; a bottom chassis positioned in a rear direction of the display panel; a rear cover covering a rear side of the bottom chassis; a stand member being accommodatable on the rear cover and selectively coupled with a rear surface of the rear cover, wherein the rear cover includes an accommodating portion in which the stand member is accommodated and a coupling portion which is coupled with the stand member, and the stand member includes an inserting protrusion which is inserted into the accommodating portion in an up-down direction and into the coupling portion in a front-back direction.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
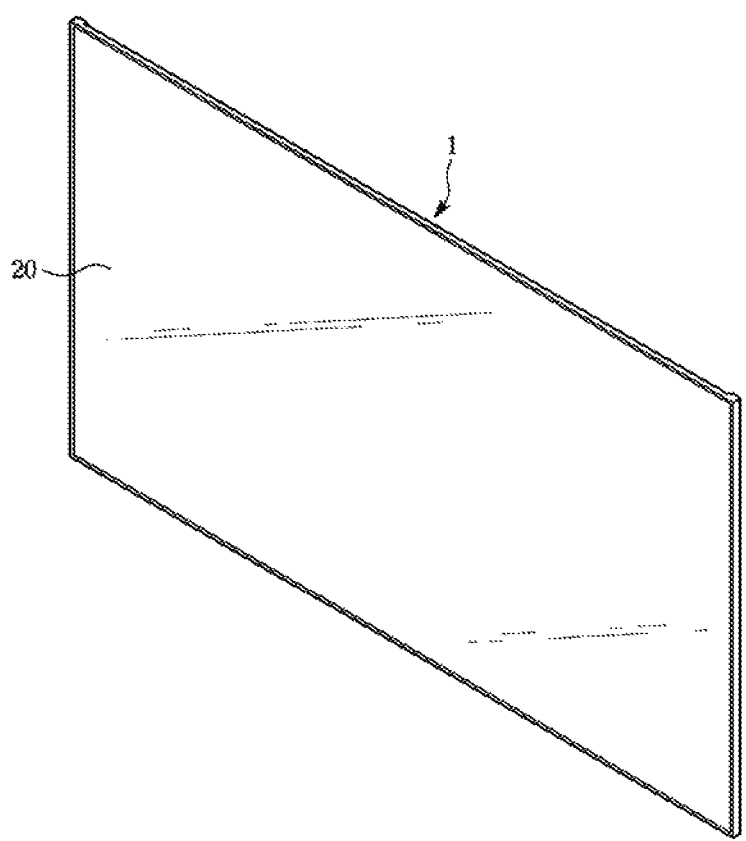
FIG. 1 is a perspective view of a display apparatus according to a first embodiment of the disclosure.

Configurations illustrated in the embodiments and the drawings described in the present specification are only the preferred embodiments of the present disclosure, and thus it is to be understood that various modified examples, which may replace the embodiments and the drawings described in the present specification, are possible when filing the present application.

Also, like reference numerals or symbols denoted in the drawings of the present specification represent members or components that perform the substantially same functions.

The terms used in the present specification are merely used to describe embodiments, and are not intended to limit and/or restrict the disclosure. An expression used in the singular encompasses the expression of the plural, unless it has a clearly different meaning in the context. In the present specification, it is to be understood that the terms such as "including" or "having," etc., are intended to indicate the existence of the features, numbers, operations, components, parts, or combinations thereof disclosed in the specification, and are not intended to preclude the possibility that one or more other features, numbers, operations, components, parts, or combinations thereof may exist or may be added.

Also, it will be understood that, although the terms "first", "second", etc., may be used herein to describe various components, these components should not be limited by these terms. The above terms are used only to distinguish one component from another. For example, a first component discussed below could be termed a second component, and similarly, a second component may be termed a first component without departing from the scope of right of the disclosure. As used herein, the term "and/or" includes any and all combinations of one or more of associated listed items.

Hereinafter, the embodiments of the disclosure will be described in detail with reference to the accompanying drawings.

Figure 2:
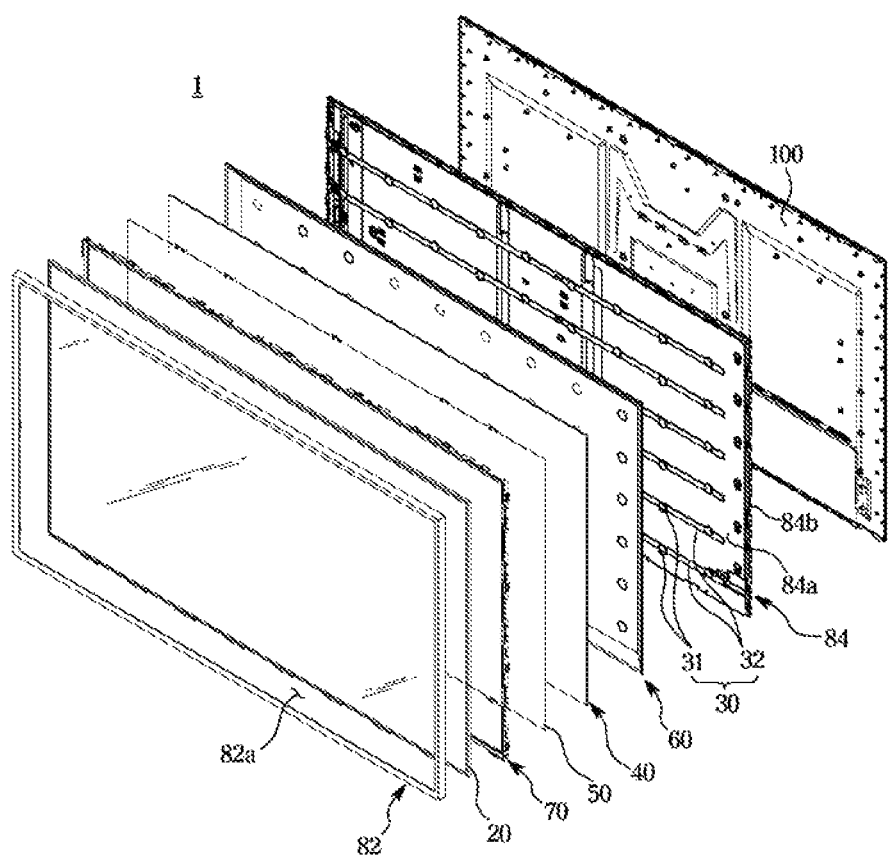
FIG. 2 is an exploded perspective view of the display apparatus according to the first embodiment of the disclosure.

FIG. 1 is a perspective view of a display apparatus according to a first embodiment of the disclosure, and FIG. 2 is an exploded perspective view of the display apparatus according to the first embodiment of the disclosure.

The following descriptions of the disclosure relate to an example of a flat display apparatus 1, however, may be applicable to a curved display apparatus or a bendable display apparatus.

Also, the terms 'front direction' or 'front surface' used in the present specification is defined based on a front surface of a display panel 20, on which the display panel 20 displays an image with respect to the display apparatus 1 shown in FIG. 1. The terms 'upper portion' and 'lower portion' respectively represent an upper portion and a lower portion of the display apparatus 1 shown in FIG. 1 with respect to the front direction or front surface, and the terms 'both sides' and 'side direction' respectively represent left and right directions of the display apparatus 1 shown in FIG. 1.

The display apparatus 1 may include a display module for displaying images therein.

The display apparatus 1 may include a chassis assembly for accommodating and supporting the display panel 20 and a backlight unit.

The display panel 20 may be a liquid crystal panel manufactured by filling and sealing up liquid crystal between two glass substrates (not shown) each including electrodes. The display panel 20 may display images on the front surface.

The chassis assembly may include a top chassis 82, a middle mold 70, and a bottom chassis 84.

The top chassis 82 may include an opening 82a for exposing the display panel 20. The bottom chassis 84 may include a bottom portion 84a positioned below the backlight unit, and a bottom side portion 84b extending upward from the bottom portion 84a.

On the bottom chassis 84, various components of the display apparatus 1, such as the top chassis 82 and the middle mold 70, may be fixed and supported.

The bottom chassis 84 may radiate heat generated from a plurality of light sources 31 to the outside. That is, heat generated from the light sources 31 may be transferred to the bottom chassis 84 via a printed circuit board (PCB) 32, and radiated through the bottom chassis 84. In order to radiate heat, the bottom chassis 84 may be made of aluminum having high heat conductivity, various kinds of metal materials such as SUS, or a plastic material such as ABS. Also, the PCB 32 may also be a metal PCB made of aluminum having high heat conductivity.

However, unlike the current embodiment, at least one of the top chassis 82, the middle mold 70, and the bottom chassis 84 may be omitted, or the top chassis 82, the middle mold 70, and the bottom chassis 84 may be integrated into one body.

The display apparatus 1 may further include a rear cover 100 surrounding the chassis assembly and covering a rear side of the bottom chassis 84 to protect and accommodate the chassis assembly.

The display apparatus 1 may further include the backlight unit for supplying light to the display panel 20.

In the current embodiment, the backlight unit may be a direct type in which the light sources 31 are positioned straightly below the display panel 20. The backlight unit may include a light source module 30 configured with the light sources 31 and the PCB 32 on which the light sources 31 are mounted, and various optical sheets 50 positioned on a traveling path of light emitted from the light sources 31.

The light sources 31 may supply light to the display panel 20. The light sources 31 may include Light Emitting Diodes (LEDs). The LEDs may be provided in a form of a package in which LED chips are mounted on a substrate and a resin is filled. However, unlike the current embodiment, the light sources 31 may be Cold Cathode Fluorescent Lamps (CCFLs) or External Electrode Fluorescent Lamps (EEFLs).

On the PCB 32, the plurality of light sources 31 may be mounted at preset intervals. On the PCB 32, a circuit pattern, etc. may be printed to transfer driving power and signals to the light sources 31. The PCB 32 may be rested on the bottom chassis 84.

Light emitted from the light sources 31 may be supplied directly to the display panel 20, unlike an edge type display apparatus, although not limited thereto. However, the rear cover 100 and a stand member 200 (which will be described later) of the display apparatus 1 according to a concept of the disclosure may be applicable to an edge type display apparatus.

To improve optical characteristics of light exiting the light sources 31, the optical sheets 50 may be positioned between the light sources 31 and the display panel 20.

The backlight unit may include a diffuser sheet 40. The diffuser sheet 40 may cancel or reduce light irradiated from the light sources 31. Because light irradiated from the light sources 31 directly enters eyes, an arrangement pattern of the light sources 31 may be presented as it is to the eyes. Therefore, the diffuser sheet 40 may cancel or reduce the pattern.

Generally, the diffuser sheet 40 may be a component of the optical sheets 50 and may be included in the optical sheets 50. That is, the diffuser sheet 40 may diffuse light irradiated from the light source module 30 in all directions so that a uniform amount of light is displayed in all directions on an image.

The backlight unit may further include a reflector sheet 60 that reflects light to prevent optical loss. The reflector sheet 60 may reflect light emitted from the light sources 31 to cause the light to be incident toward the diffuser sheet 40. The reflector sheet 60 may be formed in various forms, such as a sheet, a film, a plate, etc. For example, the reflector sheet 60 may be formed by coating a base material with a high-reflective coating material. The base material may be SUS, BRASS, aluminum, PET, etc. and the high-reflective coating material may be silver, $TiO_2$, etc. The reflector sheet 60 may be rested and supported on the PCB 32.

The rear cover 100 may cover side edges of the display apparatus 1 while covering a rear side of the bottom chassis 84, as described above, although not limited thereto. However, a component such as an additional frame or housing may be provided to cover the side edges of the display apparatus 1. In the following description, the rear cover 100 is assumed to be a component covering the side edges of the display apparatus 1.

The display apparatus 1 may be mounted on a wall to be positioned in a mount type, or stand on the floor by a stand to be positioned in a stand type, according to a user's need.

Generally, in the case in which a display apparatus is assembled on a wall, a stand for holding the display apparatus may be stored separately, and in this case, a situation in which the stand is lost may occur.

A user may position the display apparatus in the mount type or the stand type, according to a space. In the case in which the user intending to change a position of the display apparatus from the mount type to the stand type loses the stand stored separately, a problem may occur.

To prevent the stand from being lost, the stand member 200 for holding the display apparatus 1 according to an embodiment of the disclosure may be accommodated in the rear cover 100.

More particularly, the display apparatus 1 may include the stand member 200, wherein the stand member 200 is accommodated on the rear cover 100 in the case in which the display apparatus 1 is supported on a wall, and in the case in which the display apparatus 1 is supported on a floor, the stand member 200 is taken out of the rear cover 100 and assembled into the display apparatus 1 to hold the display apparatus 1 on the floor.

The operation will be described in detail, below.

Figure 3:
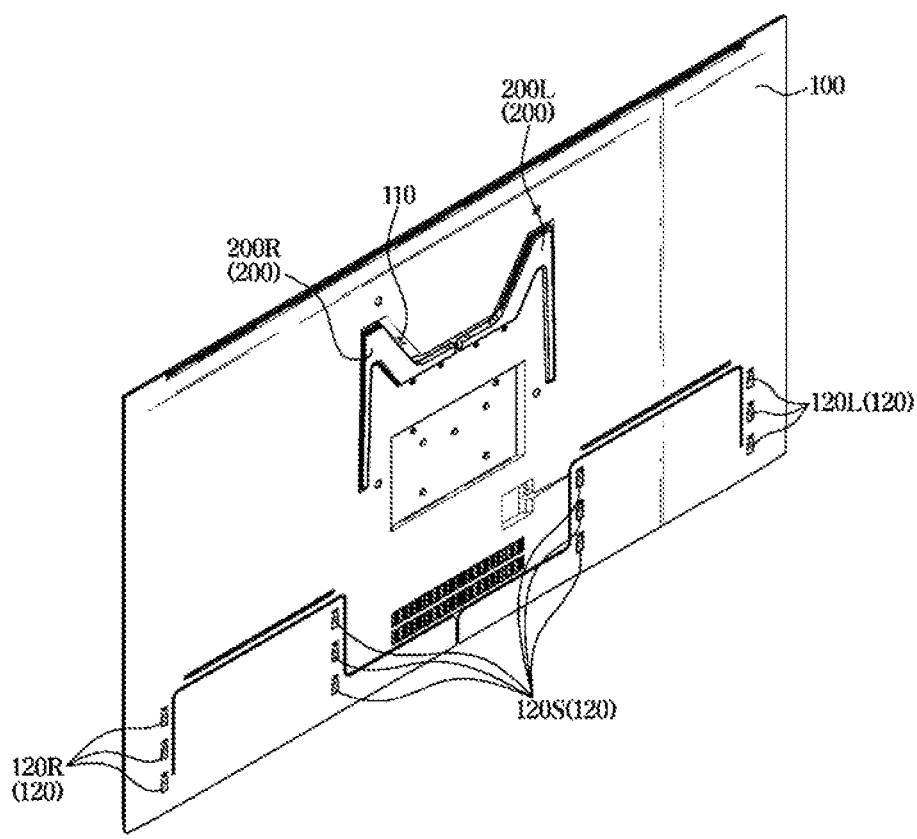
FIG. 3 is a rear perspective view of the display apparatus according to the first embodiment of the disclosure.
Figure 4A:
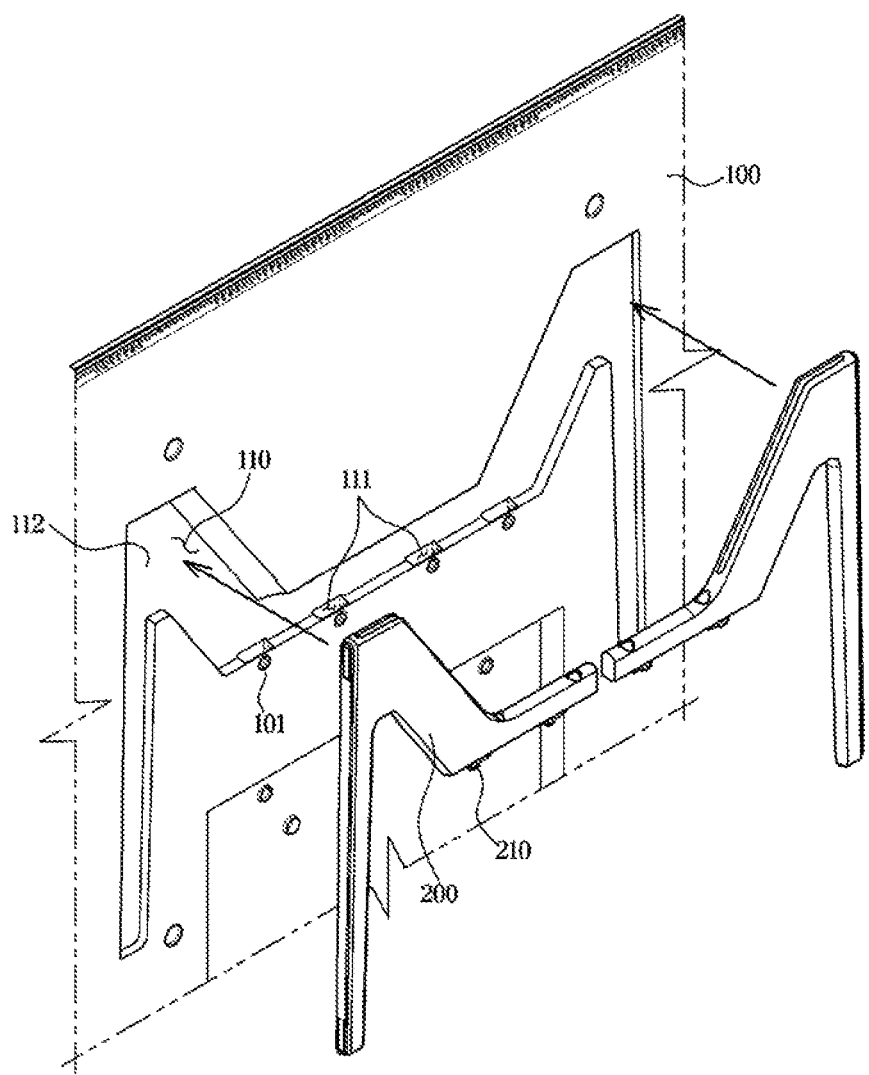
FIGS. 4A to 4C show a state in which a stand member of the display apparatus according to the first embodiment of the disclosure is accommodated in an accommodating portion.
Figure 4B:
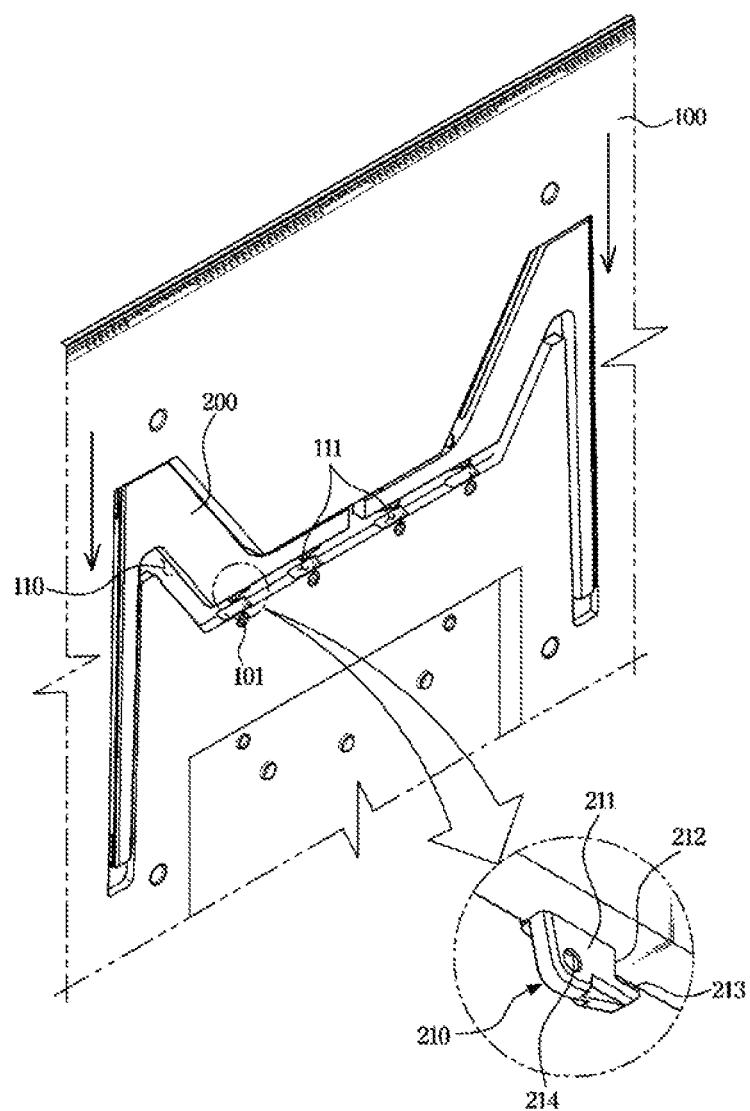
Figure 4C:
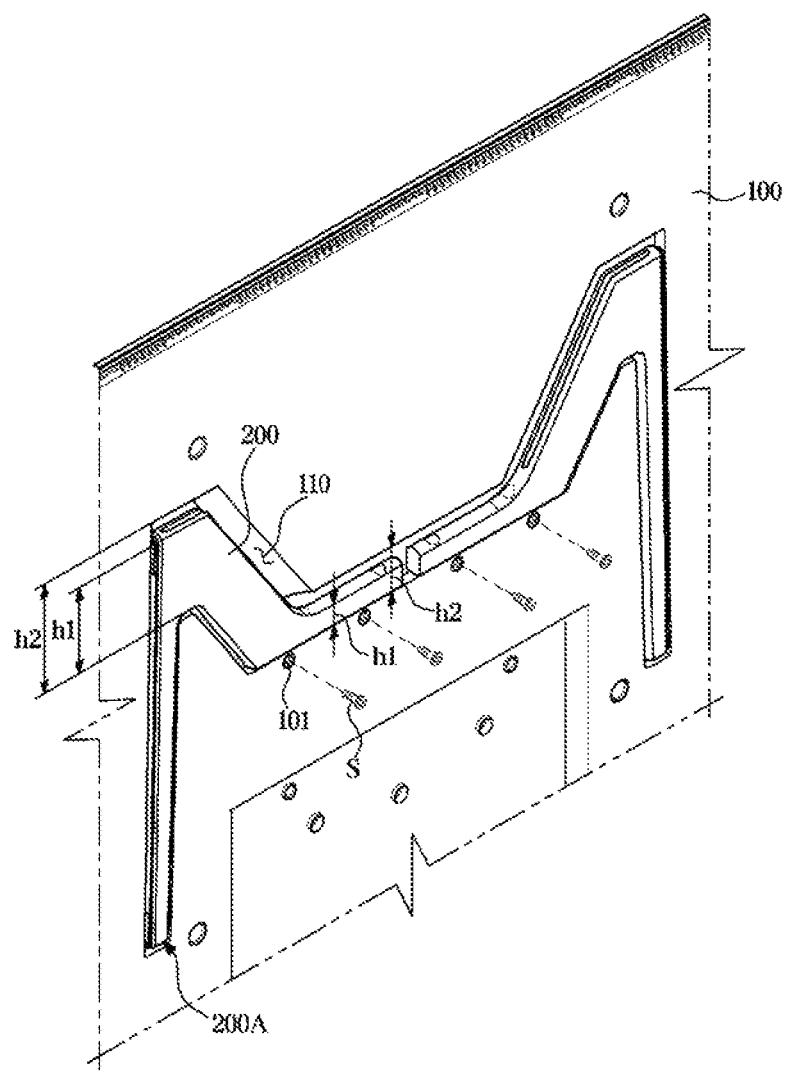
Figure 5A:
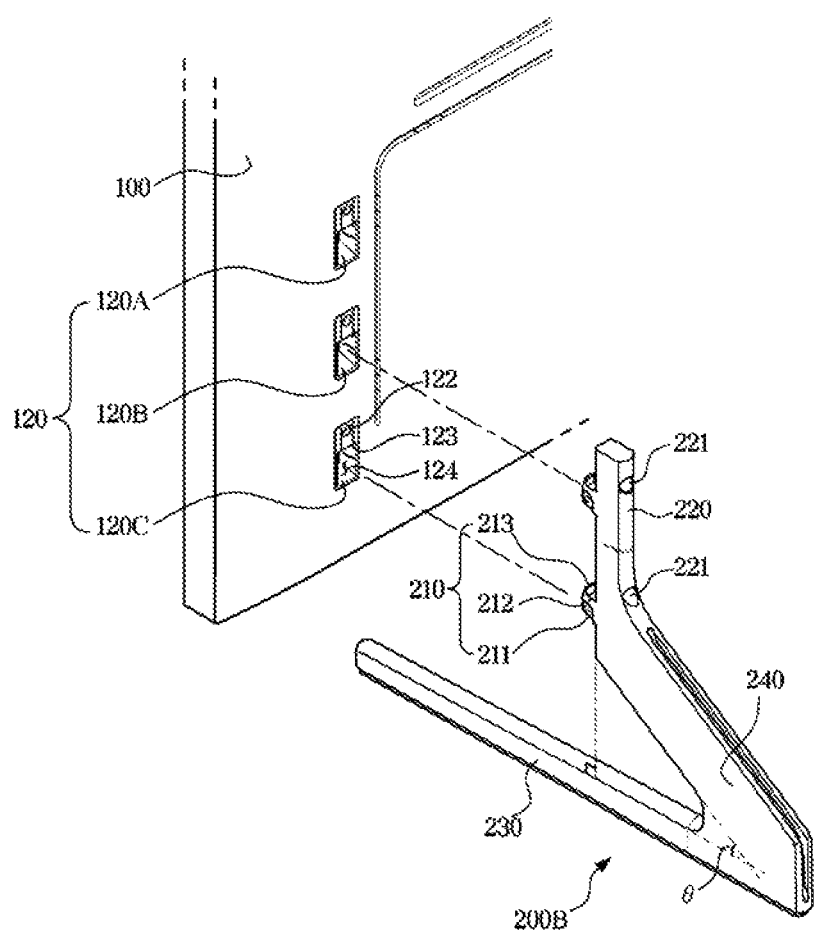
FIGS. 5A and 5B show a state in which the stand member of the display apparatus according to the first embodiment of the disclosure is assembled into the display apparatus.
Figure 5B:
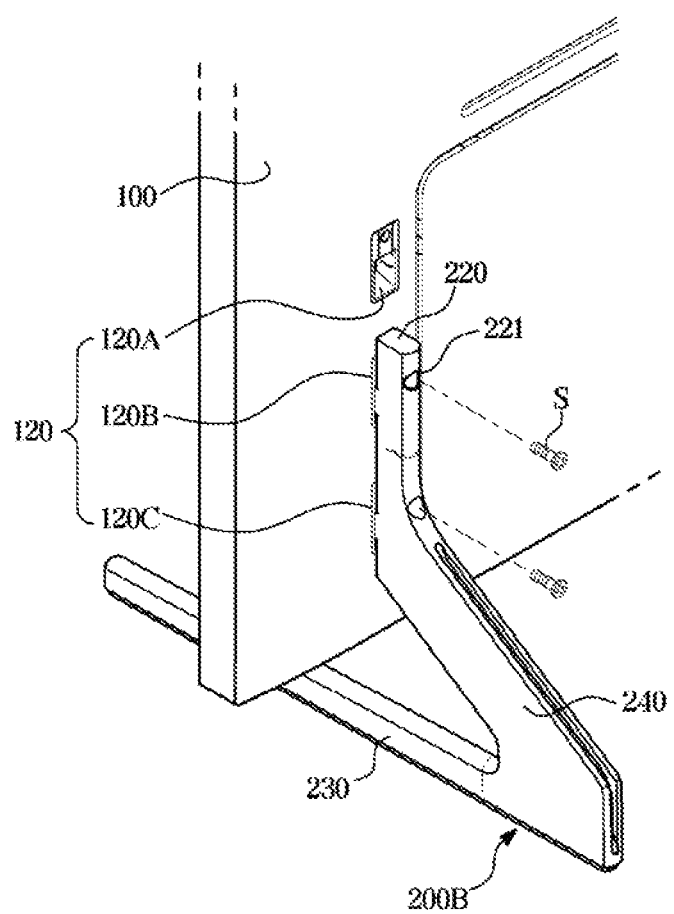
Figure 6:
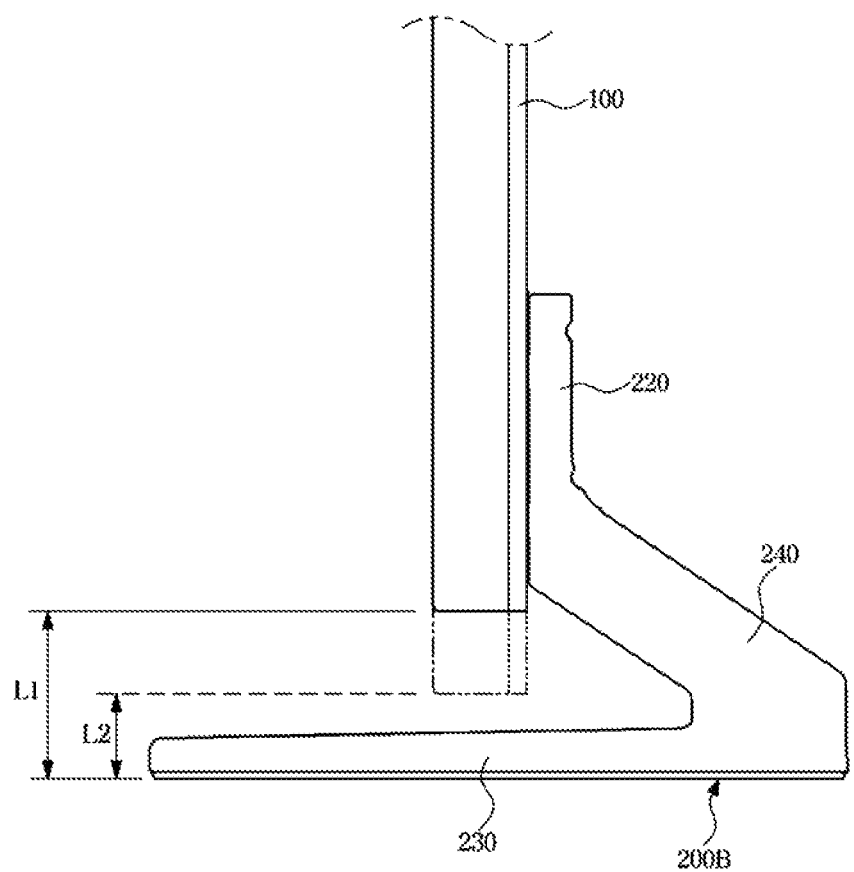
FIG. 6 is a side view of the stand member assembled into the display apparatus according to the first embodiment of the disclosure.

FIG. 3 is a rear perspective view of the display apparatus according to the first embodiment of the disclosure, FIGS. 4A to 4C show a state in which a stand member of the display apparatus according to the first embodiment of the disclosure is accommodated in an accommodating portion, FIGS. 5A and 5B show a state in which the stand member of the display apparatus according to the first embodiment of the disclosure is assembled into the display apparatus, and FIG. 6 is a side view of the stand member assembled into the display apparatus according to the first embodiment of the disclosure.

The rear cover 100 of the display apparatus 1 according to the first embodiment of the disclosure may include an accommodating portion 110 in which the stand member 200 is accommodated and a coupling portion 120 coupled with the stand member 200.

The display apparatus 1 may include the stand member 200 which is accommodated in the accommodating portion 110 in the case in which the display apparatus 1 is positioned in the mount type, and coupled with the coupling portion 120 in the case in which the display apparatus 1 is positioned in the stand type.

The stand member 200 may be provided as a pair of stand members 200R and 200L which are respectively coupled with left and right sides of the display apparatus 1, as shown in FIG. 3. Because the pair of stand members 200R and 200L are the same components, one stand member 200 of the pair of stand members 200R and 200R will be described for convenience of description.

The accommodating portion 110 may be formed in a shape of a groove corresponding to a shape of the stand member 200 such that the stand member 200 is accommodated on the rear cover 100. More particularly, the accommodating portion 110 may be formed to correspond to a side-by-side arrangement of the pair of stand members 200R and 200L.

The coupling portion 120 may be formed as a pair of coupling portions 120R and 120L which are respectively coupled with the pair of stand members 200R and 200L. However, because the pair of coupling portions 120R and 120L are the same components, like the pair of stand members 200R and 200L, one coupling member 120 of the pair of coupling portions 120R and 120L will be described.

The pair of coupling portions 120R and 120L may be respectively positioned adjacent to the left and right edges of the display apparatus 1 so that the display apparatus 1 may be stably supported by the stand member 200 coupled with the display apparatus 1.

The coupling portion 120 may further include a pair of supplementary coupling portions 120S, in addition to the pair of coupling portions 120R and 120L. The pair of supplementary coupling portions 120S may be positioned in a center portion in left-right direction of the display apparatus 1, compared to the pair of coupling portions 120R and 120L, although not limited thereto. However, the pair of supplementary coupling portions 120S may be a plurality of supplementary coupling portions.

Accordingly, the user may selectively couple the pair of stand members 200R and 200L with the pair of coupling portions 120R and 120L or the pair of supplementary coupling portions 120S, as necessary.

Hereinafter, a characteristic by which the stand member 200 is accommodated in the accommodating portion 110 will be described.

As shown in FIG. 4A, the stand member 200 may approach the accommodating portion 110 in a front-back direction and then be accommodated in the accommodating portion 110. The stand member 200 may approach the accommodating portion 110 until contacting an accommodating surface 112 of the accommodating portion 110 in parallel to the accommodating surface 112, and then be accommodated in the accommodating portion 110.

Thereafter, as shown in FIG. 4B, after the stand member 200 is positioned adjacent to the accommodating surface 112, the stand member 200 may move downward to be fixed to the accommodating portion 110.

The stand member 200 may include an inserting protrusion 210 protruding from a portion of the stand member 200. The inserting protrusion 210 may be, upon the downward movement of the stand member 200, accommodated in an inserting hole 111 positioned at a portion of the accommodating portion 110 and formed in an up-down direction.

The inserting protrusion 210 may be accommodated in the inserting hole 111 in the up-down direction so that the stand member 200 may be fixed to and supported in the accommodating portion 110.

The inserting protrusion 210, which will be described later together with a body portion 211 to be inserted into the inserting hole 111, may include a support portion 212 formed at one portion of the body portion 211 and supporting at least one portion of the coupling portion 120 upon insertion of the body portion 211 into the coupling portion 120, and a hook 213 extending in the up-down direction from one end of the support portion 212.

Also, the inserting protrusion 210 may include a screw coupling hole 214 which is screw-coupled with the rear cover 100 after the body portion 211 is accommodated in the insertion hole 111, which will be described later.

As shown in FIG. 4C, a length h1 in up-down direction of the stand member 200 from a location in the left-right direction may be shorter than a length h2 in up-down direction of the accommodating portion 110 from the same location in the left-right direction.

Accordingly, the stand member 200 may be movable in the up-down direction in the state of being accommodated in the accommodating portion 110. Because the length h2 in up-down direction of the accommodating portion 110 is longer than the length h1 of the stand member 200 from the same location in the state in which the stand member 200 contacts the accommodating surface 112 in parallel to the accommodating surface 112, the stand member 200 may be movable in the up-down direction by a difference between the lengths h1 and h2 in the accommodating portion 110. Also, the inserting protrusion 210 may be movable in the left-right direction such that, after the inserting protrusion 210 is accommodated in the inserting hole 111, the inserting protrusion 210 may be fixed by the hook 213 and released from the hook 213.

After the inserting protrusion 210 is accommodated in the inserting hole 111, the inserting protrusion 210 may be coupled by a screw S to stably accommodate the stand member 200 in the accommodating portion 110. The screw coupling hole 214 may be formed in the inserting protrusion 210, and the rear cover 100 may include a screw hole 101 through which the inserting protrusion 210 accommodated in the inserting hole 111 is coupled with the rear cover 100 by the screw S together with the screw coupling hole 214, at a location corresponding to the screw coupling hole 214.

The inserting protrusion 210 may be coupled with the rear cover 100 by the screw S through the screw coupling hole 214, and accordingly, the stand member 200 may be stably accommodated in the accommodating portion 110. A process by which the stand member 200 accommodated in the accommodating portion 110 is taken out of the accommodating portion 110 is a reverse process of the above-described process by which the stand member 200 is accommodated in the accommodating portion 110, and therefore, detailed descriptions thereof will be omitted.

Hereinafter, a process by which the stand member 200 is coupled with the rear cover 100 will be described.

The stand member 200 taken out of the accommodating portion 110 may be coupled with the coupling portion 120, as shown in FIGS. 5A to 6.

The stand member 200 may include a coupling area 220 having the inserting protrusion 210 formed thereon and contacting the rear cover 100 upon coupling of the stand member 200 with the coupling portion 120, a support area 230 supporting the display apparatus 1 upon coupling of the stand member 200 with the coupling portion 120, and a connection area 240 connecting the coupling area 220 to the support area 230.

In the case in which the stand member 200 is accommodated in the accommodating portion 110, the stand member 200 may be positioned such that a longitudinal direction of the coupling area 220 corresponds to the left-right direction of the display apparatus 1 and a longitudinal direction of the support area 230 corresponds to the up-down direction of the display apparatus 1, and then accommodated in the accommodating portion 110.

In the case in which the stand member 200 is taken out of the accommodating portion 110 and then coupled with the coupling portion 120, the stand member 200 may be positioned such that the longitudinal direction of the coupling area 220 corresponds to the up-down direction of the display apparatus 1 and the longitudinal direction of the support area 230 corresponds to the front-back direction of the display apparatus 1, thus supporting the display apparatus 1.

That is, a position of the stand member 200 accommodated in the accommodating portion 110 may be different from a position of the stand member 200 coupled with the coupling portion 120.

The coupling area 220 may be orthogonal to the support area 230. More particularly, the longitudinal direction of the coupling area 220 may be orthogonal to the longitudinal direction of the support area 230.

Also, the connection area 240 may extend from the support area 230 to be inclined at a preset angle with respect to the support area 230.

The coupling portion 120 may include a plurality of coupling portions 120A, 120B, and 120C into which the inserting protrusion 210 is inserted in the front-back direction.

The plurality of coupling portions 120A, 120B, and 120C may be spaced in the up-down direction. The number of the plurality of coupling portions 120A, 120B, and 120C may be more than the number of the inserting protrusion 210.

That is, according to the first embodiment of the disclosure, two inserting protrusions 210 may be formed in the stand member 200, and three coupling portions 120A, 120B, and 120C may be formed, although not limited thereto. However, in the case in which three inserting protrusions or more are provided, four coupling portions or more may be provided.

An upper one of the plurality of coupling portions 120A, 120B, and 120C is referred to as a first coupling portion 120A, a lower one of the plurality of coupling portions 120A, 120B, and 120C is referred to as a second coupling portion 120C, and a center one of the plurality of coupling portions 120A, 120B, and 120C is referred to as a third coupling portion 120C. A user may couple the stand member 200 with the first coupling portion 120A and the third coupling portion 120B or with the second coupling portion 120C and the third coupling portion 120B, according to his/her selection.

In the case in which the stand member 200 is coupled with the first coupling portion 120A and the third coupling portion 120B, the stand member 200 may support the display apparatus 1 such that the display apparatus 1 is spaced a length of L1 from the floor.

In the case in which the stand member 200 is coupled with the second coupling portion 120C and the third coupling portion 120B, the stand member 200 may support the display apparatus 1 such that the display apparatus 1 is spaced a length of L2 from the floor.

That is, a height at which the display apparatus 1 is supported from the floor may vary according to which two of the plurality of coupling portions 120A, 120B, and 120C the stand member 200 is coupled with. A user may selectively couple the stand member 200 with any two of the plurality of coupling portions 120A, 120B, and 120C, as necessary, to change a height at which the display apparatus 1 is supported from the floor.

Because the plurality of coupling portions 120A, 120B, and 120C have the same configuration, one coupling portion 120 of the plurality of coupling portions 120A, 120B, and 120C will be described below.

The coupling portion 120 may include a coupling hole 124 into which the inserting protrusion 210 is inserted in the front-back direction, and a support protrusion 123 by which the coupling portion 120 is supported on the support portion 212 after the inserting protrusion 210 is inserted into the coupling hole 124. The support protrusion 123 may be rested on the support portion 212 and the hook 213 of the inserting protrusion 210 to support the coupling portion 120 on the support portion 212.

A weight transferred to the support portion 212 and the hook 213 by the support protrusion 123 may be a whole weight of the display apparatus 1. Accordingly, because the display apparatus 1 is substantially incapable of being supported by the support portion 212 of the stand member 200, the inserting protrusion 210 may be inserted into the coupling hole 121 and then the screw S may be additionally coupled to firmly couple the stand member 200 with the coupling portion 120.

The hook 213 may function to locate the stand member 200 upon coupling of the stand member 200 with the coupling portion 120 by the screw S.

The coupling portion 120 may further include a screw groove 122 with which the screw S is coupled.

The coupling area 220 may include a screw coupling hole 221 which the screw S penetrates to couple the stand member 200 with the rear cover 100.

The screw S may be coupled with the screw coupling hole 221 and the screw groove 122 to firmly couple the stand member 200 with the rear cover 100.

That is, the stand member 200 may approach the coupling portion 120 in the front-back direction such that the inserting protrusion 210 is inserted into the coupling hole 121, and after the inserting protrusion 210 is inserted into the coupling hole 121, the coupling area 220 may be in contact with the rear cover 100.

Thereafter, the stand member 200 may be coupled with the rear cover 100 through the screw S. A process of decoupling the stand member 200 from the rear cover 100 is a reverse process of the above-described process, and, therefore, detailed descriptions thereof will be omitted.

The connection area 240 may extend to be at the preset angle with respect to the support area 230, as described above. The connection area 240 may extend in a diagonal direction from the support area 230, according to the first embodiment of the disclosure, although not limited thereto. However, the connection area 240 may extend to be at substantially right angles with respect to the support area 230.

Also, the connection area 240 may extend from an end of the support area 230, although not limited thereto. The connection area 240 may extend from any one end of the support area 230.

As described above, the stand member 200 may be selectively positioned at an accommodated location 200A at which the stand member 200 is accommodated in the accommodating portion 110 and at a coupled location 200B at which the stand member 200 is coupled with the coupling portion 120.

In the case in which the display apparatus 1 is positioned in the mount type, the stand member 200 may be positioned at the accommodated location 200A. Accordingly, the stand member 200 may be not exposed to the outside although the display apparatus 1 is assembled on a wall, so that an aesthetic sense may be improved and the stand member 200 may need not to be stored separately.

Also, in the case in which the display apparatus 1 is positioned in the stand type, the stand member 200 may be taken out of the accommodated location 200A and positioned at the coupled location 200B to support the display apparatus 1 on the floor.

Accordingly, the stand member 200 may be accommodated in the rear cover 100 or coupled with the rear cover 100, regardless of an installation type of the display apparatus 1, thereby being prevented from being lost.

Hereinafter, a modified example of the first embodiment of the disclosure will be described. Other components except for an accommodating portion 110' which will be described below are the same as the corresponding ones described above in the first embodiment of the disclosure, and therefore, detailed descriptions thereof will be omitted.

Figure 7:
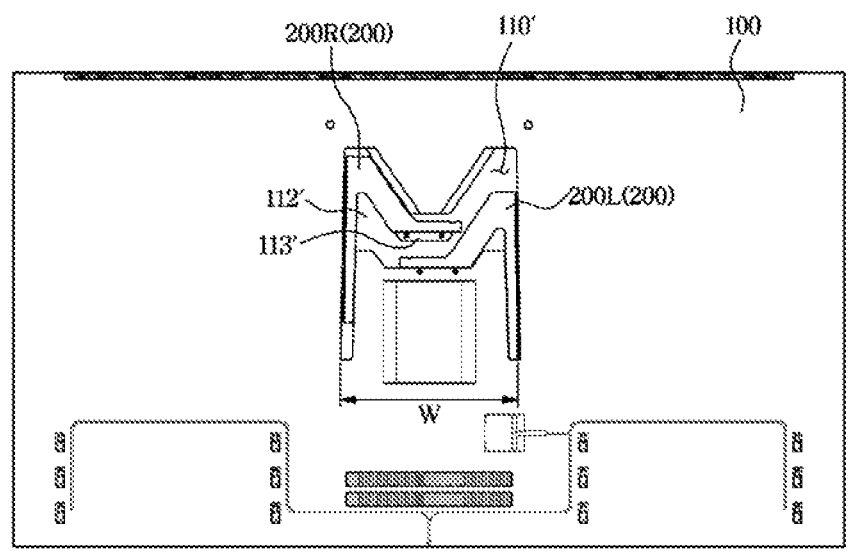
FIG. 7 is a rear view of a rear cover of a display apparatus according to a modified embodiment of the first embodiment of the disclosure.

FIG. 7 is a rear view of a rear cover of a display apparatus according to a modified embodiment of the first embodiment of the disclosure.

In the first embodiment of the disclosure as described above, a width of the accommodating portion 110 may substantially correspond to a horizontal length of the pair of stand members 200R and 200L arranged side by side. However, a width length of the accommodating portion 110 may be limited by a front portion (not shown) positioned in the front direction of the rear cover 100 of the display apparatus 1.

In consideration of such a problem, in the modified example of the first embodiment of the disclosure, a width (W) length of the accommodating portion 110' may correspond to a horizontal length of the pair of stand members 200R and 200L overlapping in at least some portions.

More particularly, a horizontal length of the pair of stand members 200R and 200L positioned such that the coupling areas 220 overlap each other in the up-down direction may correspond to a width W of the accommodating portion 110'.

An inserting hole corresponding to one stand member 200L of the pair of stand members 200R and 200L may be positioned at a lower portion of the accommodating portion 110', like the first embodiment of the disclosure as described above, whereas an inserting hole corresponding to the other stand member 200R of the pair of stand members 200R and 200L may be positioned at an accommodating surface 112'.

More particularly, an inserting portion 113' may be positioned between the coupling areas 220 of the pair of stand members 200R and 200L, and an inserting hole into which the inserting protrusion 210 of the stand member 200R of the pair of stand members 200R and 200L is inserted may be formed in the inserting portion 113'.

Accordingly, the pair of stand members 200R and 200L may overlap, instead of being arranged side by side in the left-right direction on the accommodating portion 110', so that the width W of the accommodating portion 110' may be reduced.

Hereinafter, a modified example of the first embodiment of the disclosure will be described. Other components except for the support area 230 of the stand member 200 which will be described below are the same as the corresponding ones described above in the first embodiment of the disclosure, and therefore, detailed descriptions thereof will be omitted.

Figure 8A:
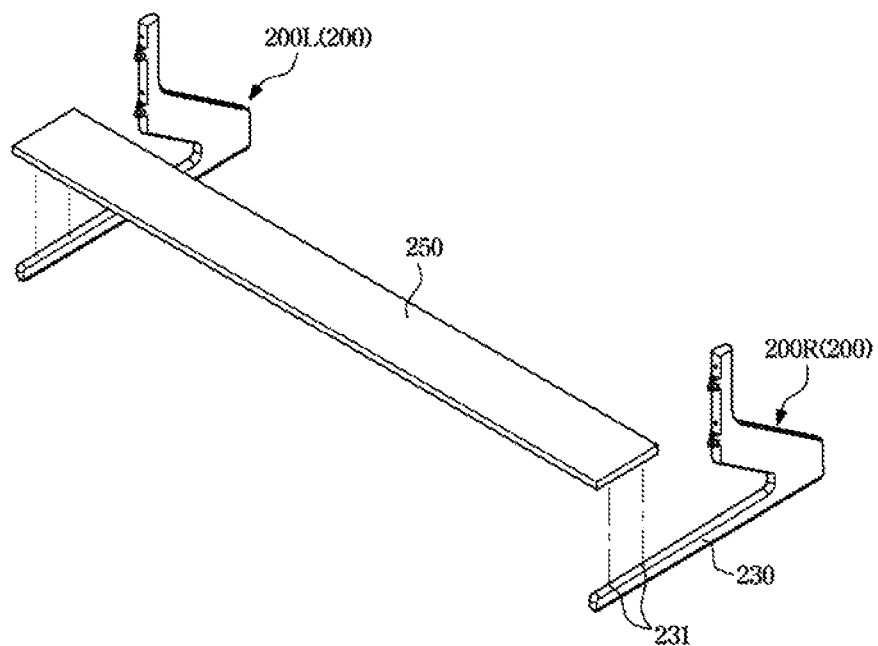
FIGS. 8A and 8B show a state in which some components of a display apparatus according to another modified embodiment of the first embodiment of the disclosure are coupled.
Figure 8B:
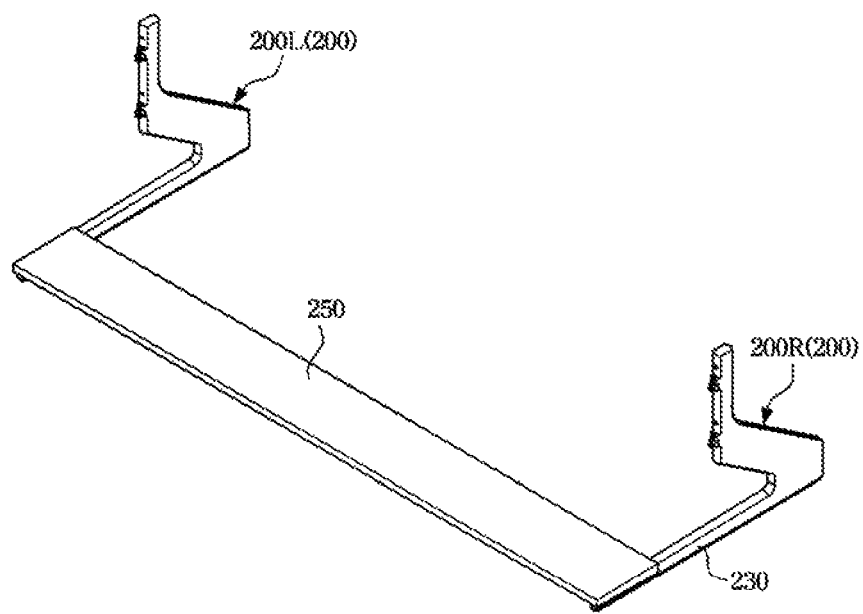
Figure 9:
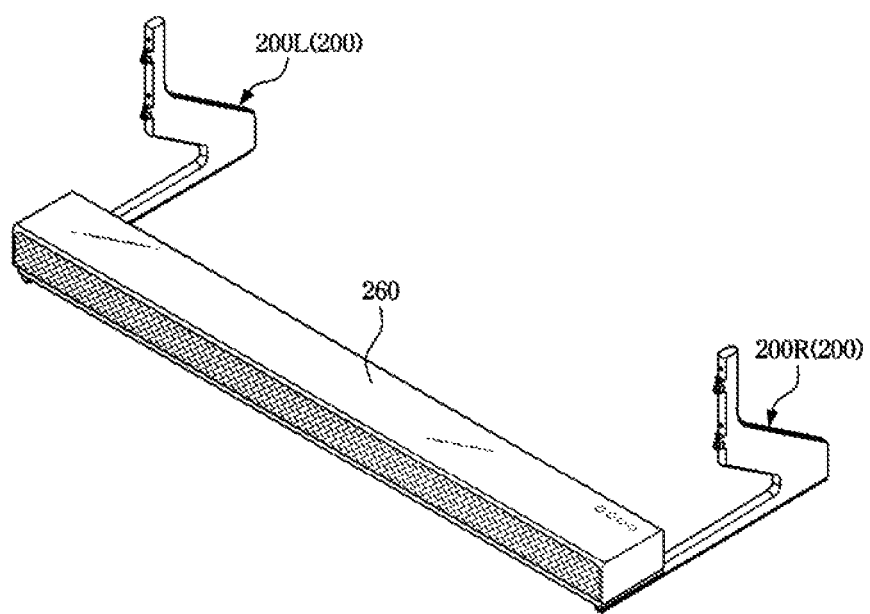
FIG. 9 is a perspective view of some components of a display apparatus according to another modified embodiment of the first embodiment of the disclosure.

FIGS. 8A and 8B show a state in which some components of a display apparatus according to another modified embodiment of the first embodiment of the disclosure are coupled, and FIG. 9 is a perspective view of some components of a display apparatus according to another modified embodiment of the first embodiment of the disclosure.

The display apparatus 1 according to a modified example of the first embodiment of the disclosure may include a connection member 250 connecting the pair of stand members 200R and 200L.

As described above, the pair of stand members 200R and 200L may be positioned adjacent to the left and right edges of the display apparatus 1.

By connecting the pair of stand members 200R and 200L spaced to the connection member 250, stability of the pair of stand members 200R and 200L may be secured. Also, the connection member 250 may provide an additional aesthetic sense.

The connection member 250 may be in a shape of a plate, although not limited thereto. However, the connection member 250 may have various shapes.

The support areas 230 of the pair of stand members 200R and 200L may include assembling portions 231 which are positioned in the upper side of the support areas 230 in the case in which the pair of stand members 200R and 200L support the display apparatus 1.

The connection member 250 may be assembled with the pair of stand members 200R and 200L by the assembling portions 231 so that the pair of stand members 200R and 200L and the connection member 250 look like one body.

Also, another component of the display apparatus 1, instead of the connection member 250, may be assembled into the assembling portion 231 of the pair of stand members 200R and 200L.

As shown in FIG. 9, a component such as a sound bar 260 for amplifying sound output from the display apparatus 1 may be assembled into the assembling portions 231, although not limited thereto. However, various additional components may be assembled into the assembling portions 231 of the pair of stand members 200R and 200L.

Hereinafter, the second embodiment of the disclosure will be described. Other components except for those which will be described below are the same as the corresponding ones described above in the first embodiment of the disclosure, and therefore, detailed descriptions thereof will be omitted.

Figure 10:
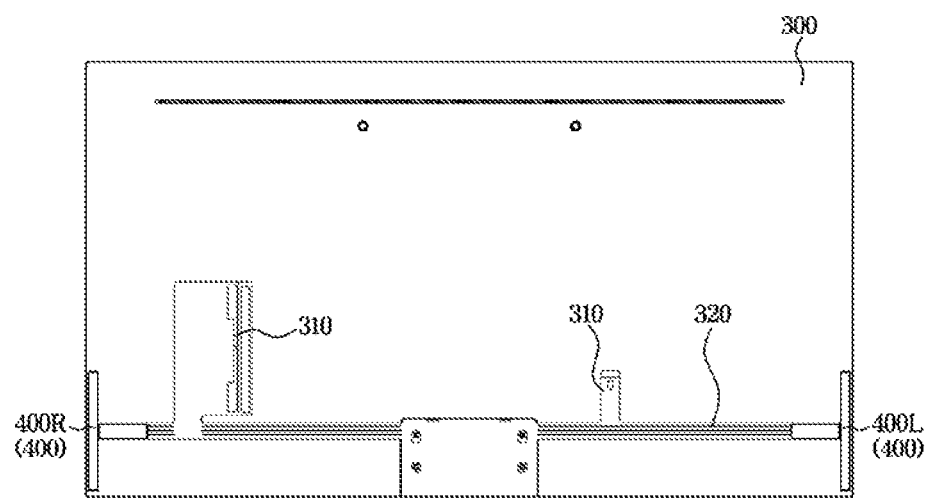
FIG. 10 is a rear view of a display apparatus according to a second embodiment of the disclosure.
Figure 11A:
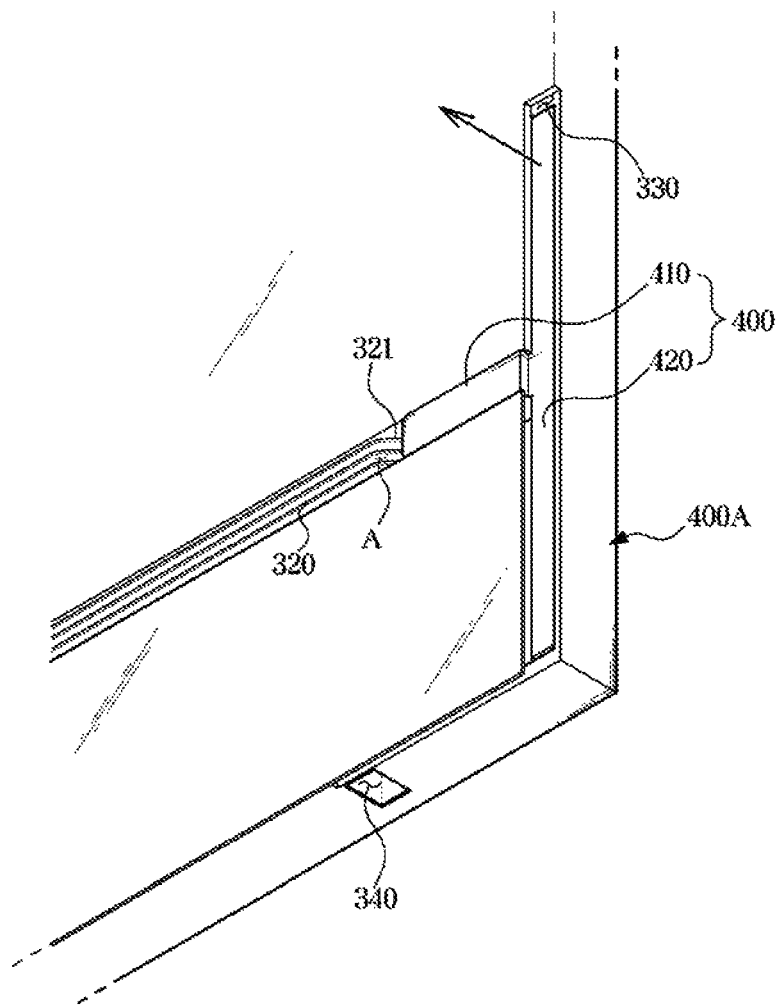
FIGS. 11A and 11B show a state in which a stand member of the display apparatus according to the second embodiment of the disclosure is taken out of an accommodating portion.
Figure 11B:
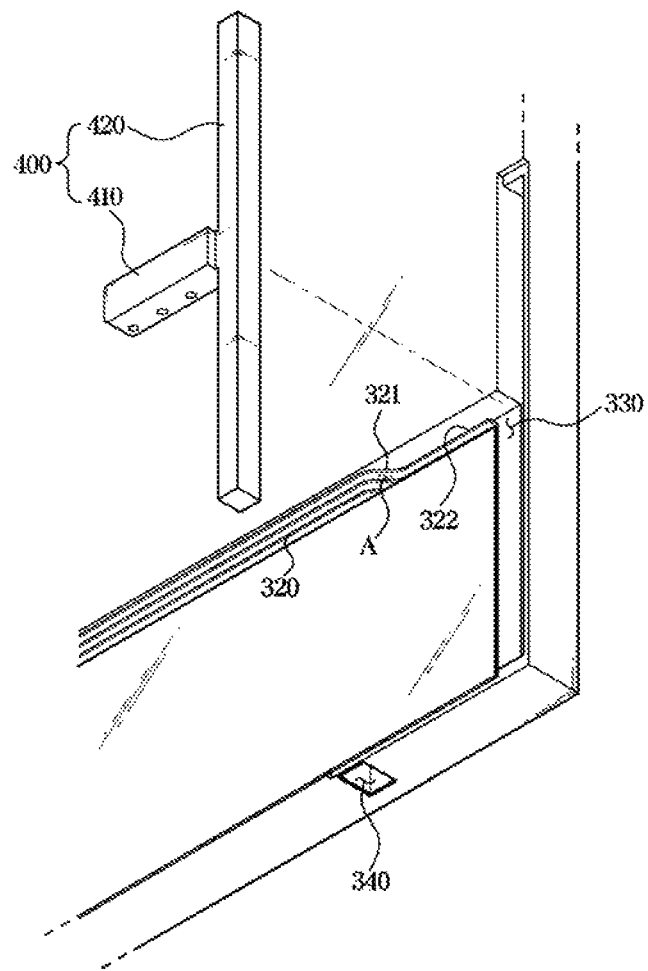
Figure 12A:
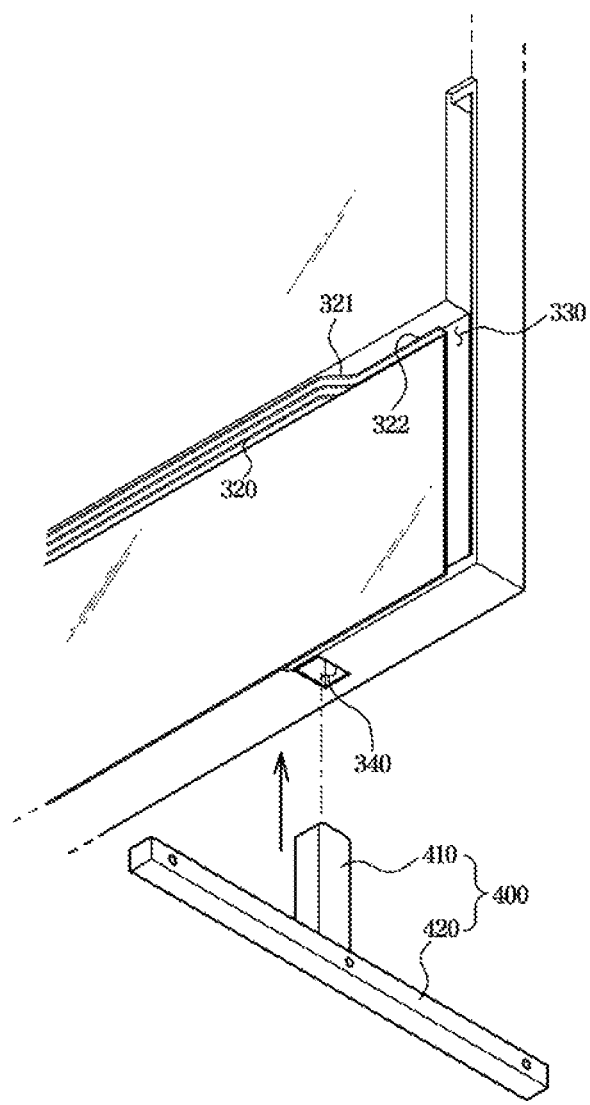
FIGS. 12A and 12B show a state in which the stand member of the display apparatus according to the second embodiment of the disclosure is assembled into the display apparatus.
Figure 12B:
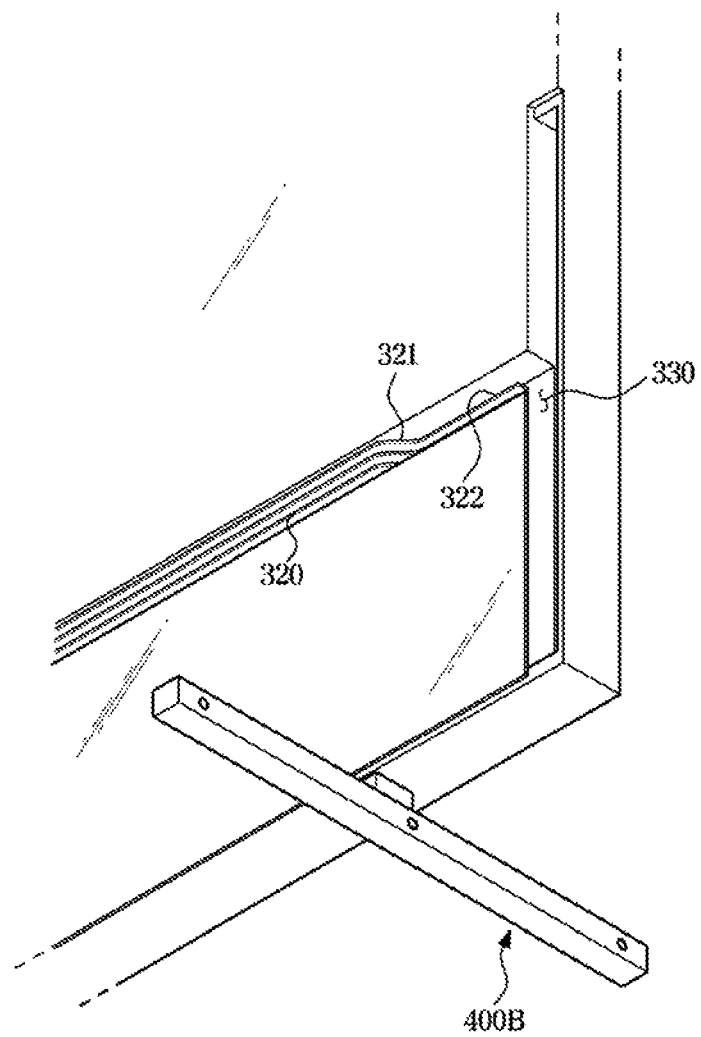
Figure 13:
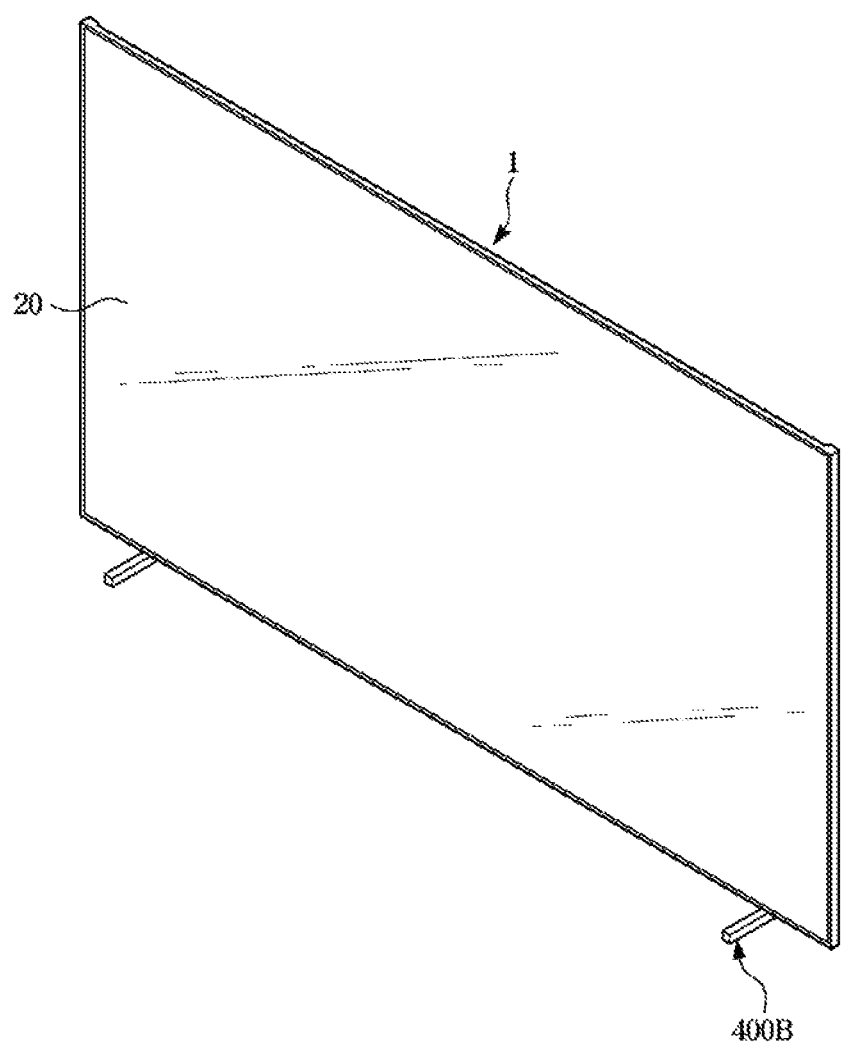
FIG. 13 is a perspective view of the display apparatus according to the second embodiment of the disclosure, into which the stand member is assembled.
Figure 14A:
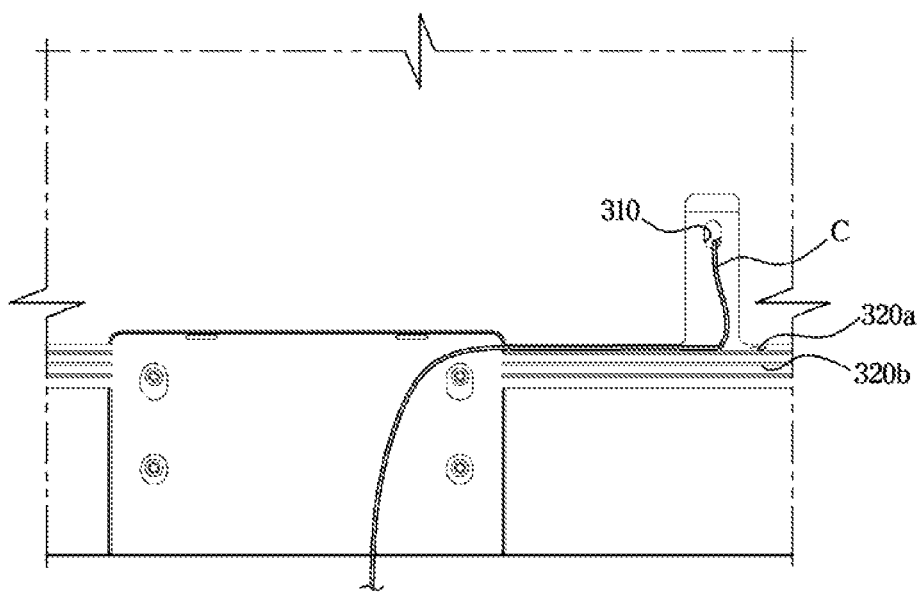
FIGS. 14A and 14B show a state in which a cable is connected to the display apparatus according to the second embodiment of the disclosure.
Figure 14B:
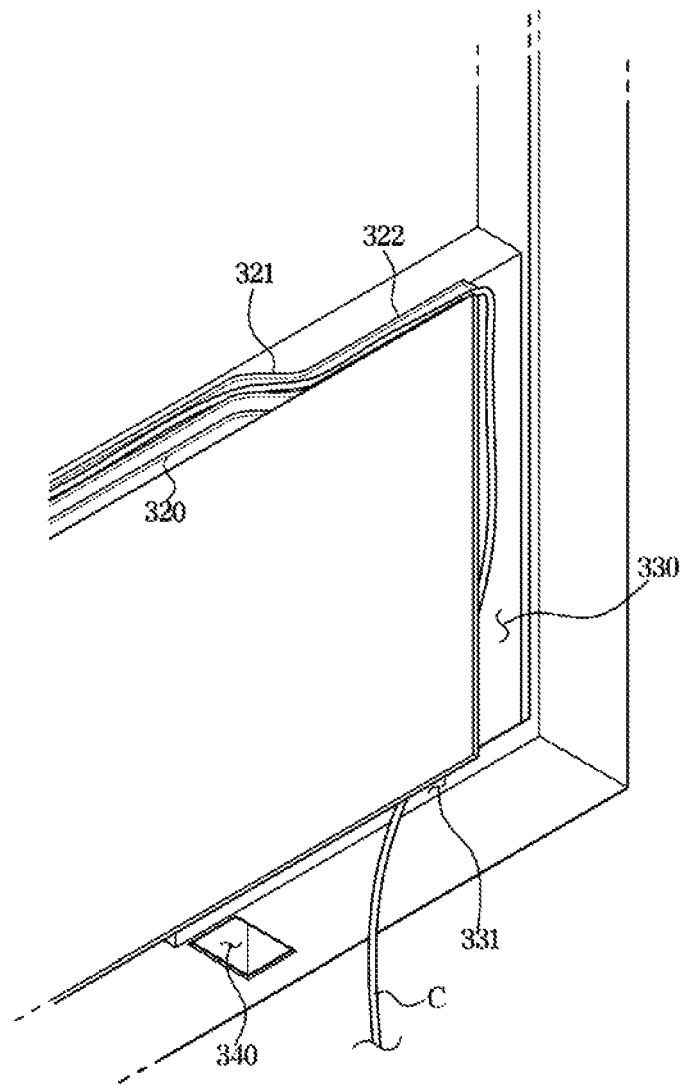

FIG. 10 is a rear view of a display apparatus according to a second embodiment of the disclosure, FIGS. 11A and 11B show a state in which a stand member of the display apparatus according to the second embodiment of the disclosure is taken out of an accommodating portion, FIGS. 12A and 12B show a state in which the stand member of the display apparatus according to the second embodiment of the disclosure is assembled into the display apparatus, FIG. 13 is a perspective view of the display apparatus according to the second embodiment of the disclosure, into which the stand member is assembled, and FIGS. 14A and 14B show a state in which a cable is connected to the display apparatus according to the second embodiment of the disclosure.

A rear cover 300 according to the second embodiment of the disclosure may include an electronic component (not shown) for controlling the display panel 20 of the display apparatus 1, a cable coupling portion 310 with which a cable C for transferring external signals to the electronic component is coupled, and a cable guide 320 for guiding a location of the cable C coupled with the cable coupling portion 310.

The display apparatus 1 may receive power or signals for displaying images from outside. The display apparatus 1 may receive the power or signals through the cable C connected to the outside.

In this case, the display apparatus 1 may adjust a position of the cable C extending to the outside of the display apparatus 1 through the cable guide 320, thereby improving an aesthetic sense of the display apparatus 1 to which the cable C is connected.

The cable guide 320 may extend in the left-right direction.

A pair of stand members 400R and 400L may be accommodated at both ends of the cable guide 320. That is, a pair of accommodating portions 330 in which the pair of stand members 400R and 400L are accommodated may be provided at both ends of the cable guide 320.

Hereinafter, one stand member 400 of the pair of stand members 400R and 400L and one accommodating portion 330 of the pair of accommodating portions 330 will be described.

The stand member 400 may include an inserting protrusion 410 which is, in the case in which the stand member 400 is accommodated in the accommodating portion 330, supported by the accommodating portion 330 and which is inserted into a coupling portion 340 which will be described later, and a support area 420 supporting the display apparatus 1 in the case in which the inserting protrusion 410 is inserted into the coupling portion 340.

The inserting protrusion 410 may be orthogonal to the support area 420. The inserting protrusion 410 may extend from one portion of the support area 420 in a direction being orthogonal to the support area 420.

The inserting protrusion 410 may extend from a center portion of the support area 420 in a direction being orthogonal to the support area 420, although not limited thereto. However, the inserting protrusion 410 may extend from another portion of the support area 420, instead of the center portion of the support area 420.

The accommodating portion 330 may have a shape corresponding to the stand member 400.

The stand member 400 may be accommodated in the accommodating portion 330 such that a longitudinal direction of the inserting protrusion 410 of the stand member 400 is toward the left-right direction of the display apparatus 1.

More particularly, an area of the accommodating portion 330 in which the inserting protrusion 410 is accommodated may extend in the left-right direction of the display apparatus 1. The area of the accommodating portion 330 in which the inserting protrusion 410 is accommodated may be connected to an end of the cable guide 320.

An area of the accommodating portion 330 in which the support area 420 is accommodated may be adjacent to a side edge of the display apparatus 1. The area of the accommodating portion 330 in which the support area 420 is accommodated may extend from the area of the accommodating portion 330 in which the inserting protrusion 410 is accommodated to be orthogonal to an extension direction of the area of the accommodating portion 330 in which the inserting protrusion 410 is accommodated.

The cable guide 320 being adjacent to one end of the accommodating portion 330 may include an inclined portion 321 inclined toward an inside of the rear cover 300. Also, the cable guide 320 may include an extension portion 322 extending from the inclined portion 321 to an inside of the accommodating portion 330.

A certain space A may be formed between the cable guide 320 and the accommodating portion 330 by the inclined portion 321, so that a user may easily grip the stand member 400 through the space A.

Also, the extension portion 322 may extend to the inside of the accommodating portion 330, as described above, to locate the cable C (which will be described later) up to the accommodating portion 330.

The stand member 400 may be positioned at an accommodated location 400A at which the stand member 400 is accommodated in the accommodating portion 330. The user may grip the stand member 400 through the space A formed by the inclined portion 321 and take the stand member 400 out of the accommodating portion 330.

Thereafter, the inserting protrusion 410 may be inserted in the up-down direction into the coupling portion 340 positioned at a lower side of the rear cover 300. Accordingly, the stand member 400 may be coupled with the display apparatus 1.

In the case in which the stand member 400 is positioned at a coupled location 400B at which the inserting protrusion 410 is inserted into and coupled with the coupling portion 340, a longitudinal direction of the support area 420 may be the front-back direction of the display apparatus 1.

Accordingly, the stand member 400 may stably support the display apparatus 1.

In the case in which the stand member 400 is positioned at the accommodated location 400A, a longitudinal direction of the inserting protrusion 410 may be a direction corresponding to the left-right direction of the display apparatus 1 or an extension direction of the cable guide 320, and the longitudinal direction of the support area 420 may be a direction corresponding to the up-down direction of the display apparatus 1.

Also, in the case in which the stand member 400 is positioned at the coupled location 400B, the longitudinal direction of the inserting protrusion 410 may be a direction corresponding to the up-down direction of the display apparatus 1, and the longitudinal direction of the support area 420 may be a direction corresponding to the front-back direction of the display apparatus 1.

The inserting protrusion 410 may be coupled with the coupling portion 340 in the up-down direction by forced-inserting to firmly couple the stand member 400 with the coupling portion 340. Also, after the inserting protrusion 410 is coupled with the coupling portion 340, the stand member 400 may be additionally bound to the rear cover 300 through screw-coupling, which is not shown in the drawings.

The cable C may be guided downward from the center portion of the display apparatus 1 or toward the coupling portion 340 through the cable guide 320.

The cable guide 320 may include a plurality of guide protrusions 320b extending in the left-right direction and a plurality of guide grooves 320a formed between the plurality of guide protrusions 320b.

The cable (C) may be accommodated in the plurality of guide grooves 320a to be guided toward the center of the display apparatus 1 or toward the coupling portion 340.

In the case in which the display apparatus 1 is mounted on a wall, the cable guide 320 may guide the cable C toward the center of the display apparatus 1, and in the case in which the display apparatus 1 is positioned on a floor in a stand type, the cable guide 320 may guide the cable C toward the coupling portion 340.

That is, the user may accommodate the cable C in the cable guide 320 in a left or right direction from the cable coupling portion 310, thereby selectively deciding an extension direction of the cable C to the outside of the display apparatus 1.

The accommodating portion 330 may include an incision portion 331 in at least one portion of the rear cover 300 such that the cable C is capable of extending toward the coupling portion 340.

In the case in which the cable C is positioned toward the coupling portion 340, the cable C may be accommodated in the inclined portion 321 and the extension portion 322 to extend up to the accommodating portion 330, and extend from the accommodating portion 330 to the outside of the accommodating portion 330 through the incision portion 331.

The above description relates to a state in which the stand member 400 is not accommodated in the accommodating portion 330. However, the cable C may extend toward the coupling portion 340 via the accommodating portion 330 even in the state in which the stand member 400 is accommodated in the accommodating portion 330.

Because the cable C is accommodated in the inclined portion 321 and the extension portion 322 to extend up to the accommodating portion 330 and extend to the outside of the accommodating portion 330 through the incision portion 331, the stand member 400 accommodated in the accommodating portion 330 may not limit an arrangement of the cable C.

Accordingly, the cable C may be positioned toward the coupling portion 340 although the display apparatus 1 is mounted on a wall.

Hereinafter, a modified example of the second embodiment of the disclosure will be described. Other components except for those described below are the same as the corresponding ones described above in the first embodiment of the disclosure, and therefore, detailed descriptions thereof will be omitted.

Figure 15:
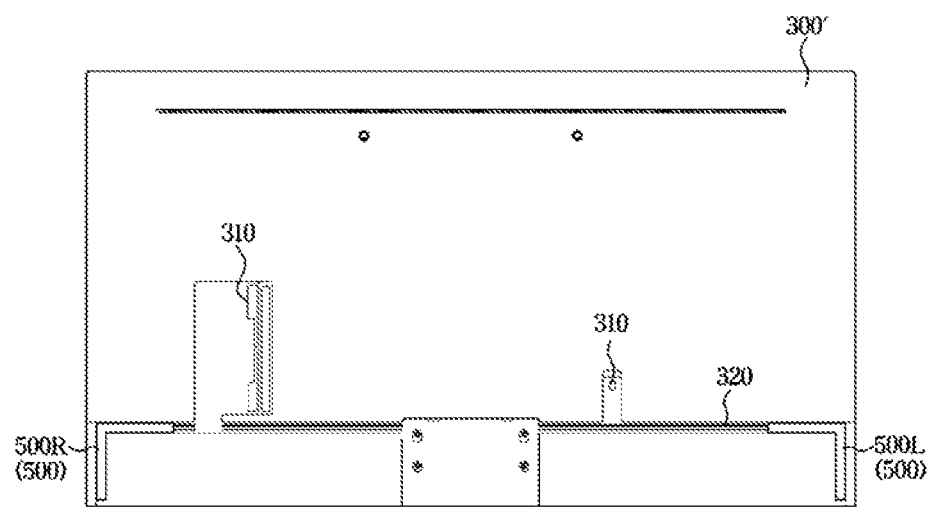
FIG. 15 is a rear view of a display apparatus according to a modified example of the second embodiment of the disclosure.
Figure 16A:
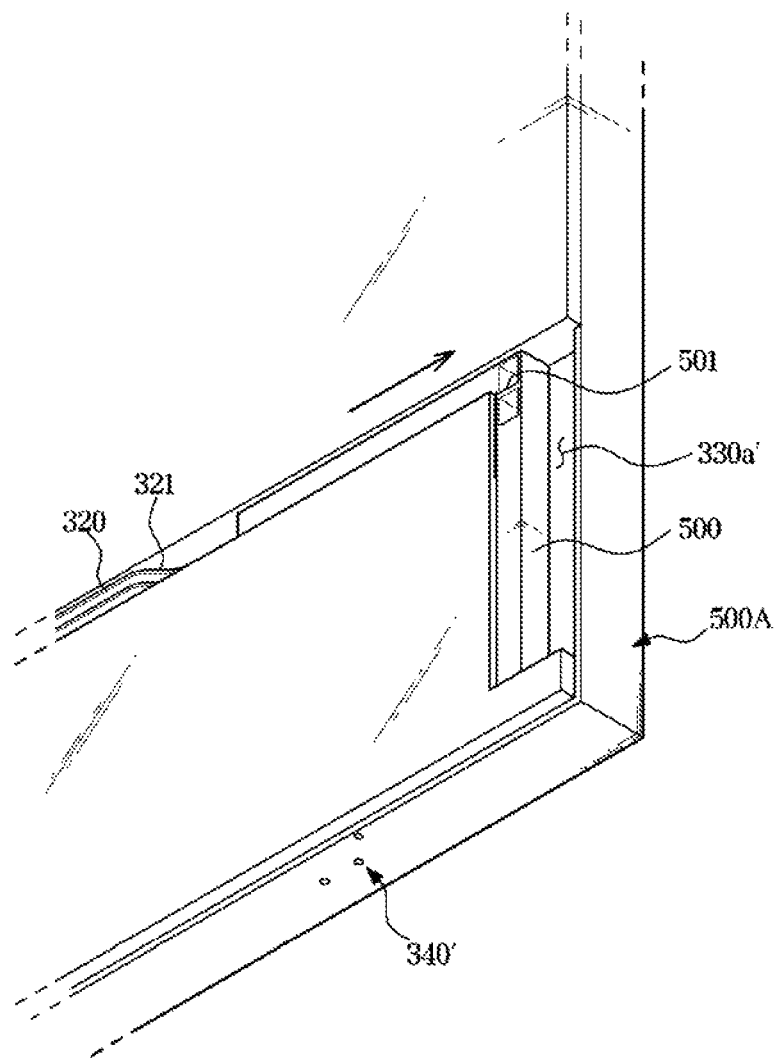
FIGS. 16A and 16B show a state in which a stand member of the display apparatus according to the modified example of the second embodiment of the disclosure is taken out of an accommodating portion.
Figure 16B:
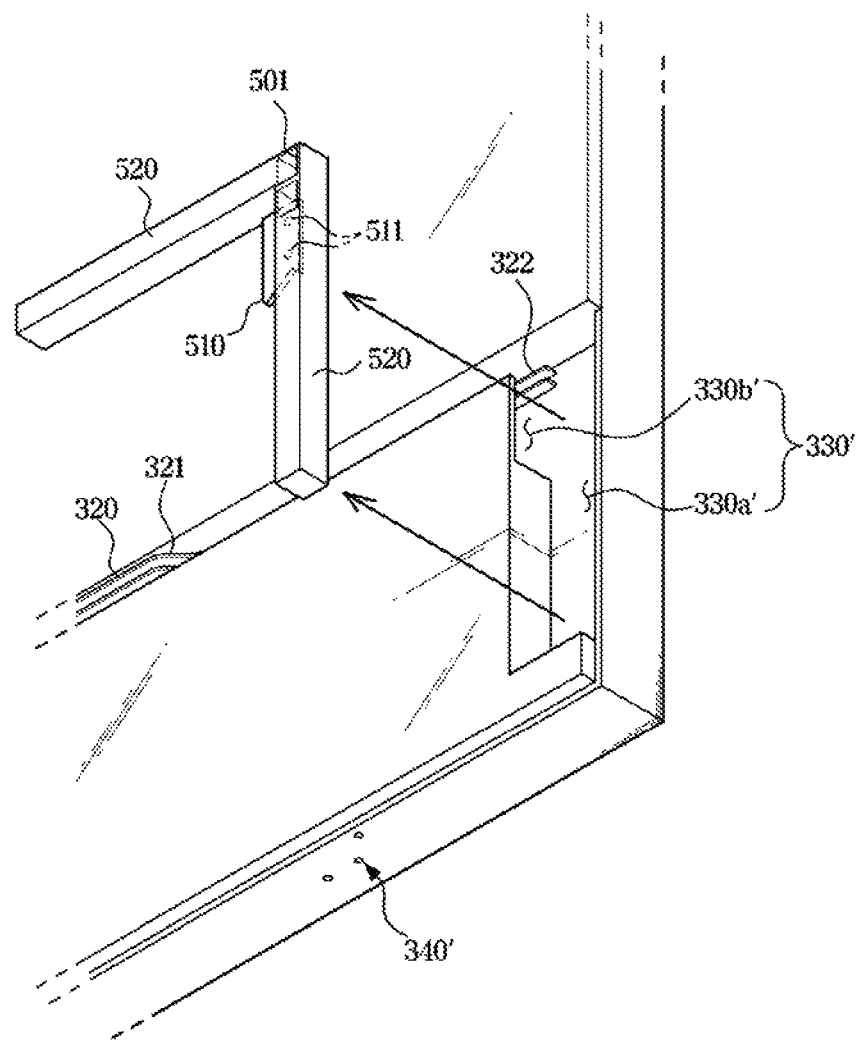
Figure 17:
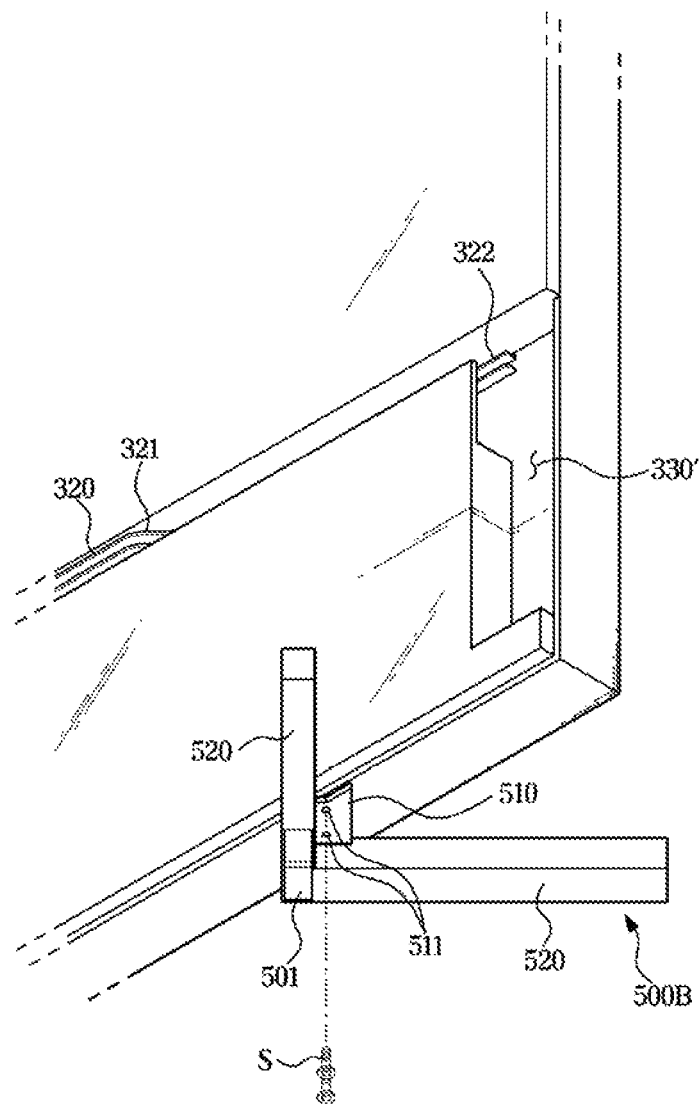
FIG. 17 shows a state in which the stand member of the display apparatus according to the modified example of the second embodiment of the disclosure is assembled into the display apparatus.
Figure 18:
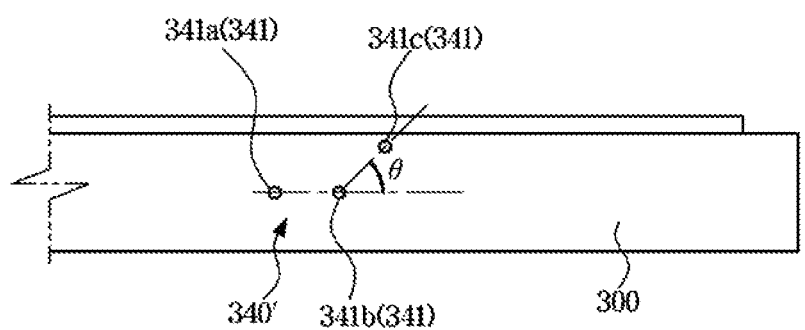
FIG. 18 shows a coupling portion of the display apparatus according to the modified example of the second embodiment of the disclosure.
Figure 19A:
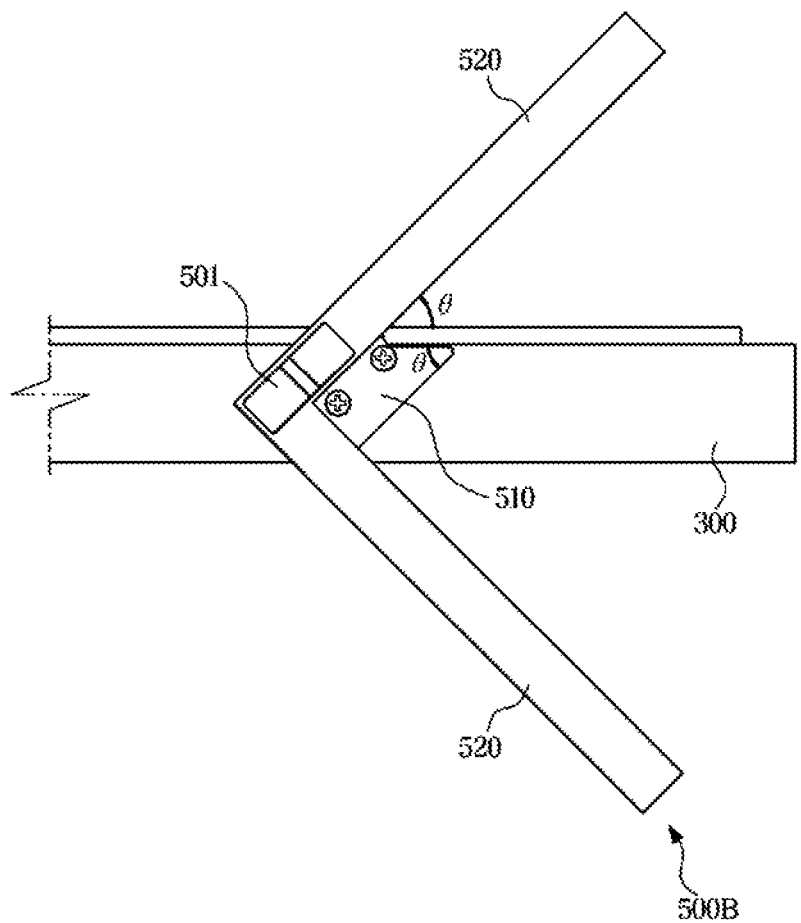
FIGS. 19A and 19B show a state in which the stand member of the display apparatus according to the modified example of the second embodiment of the disclosure is coupled in a first type.
Figure 19B:
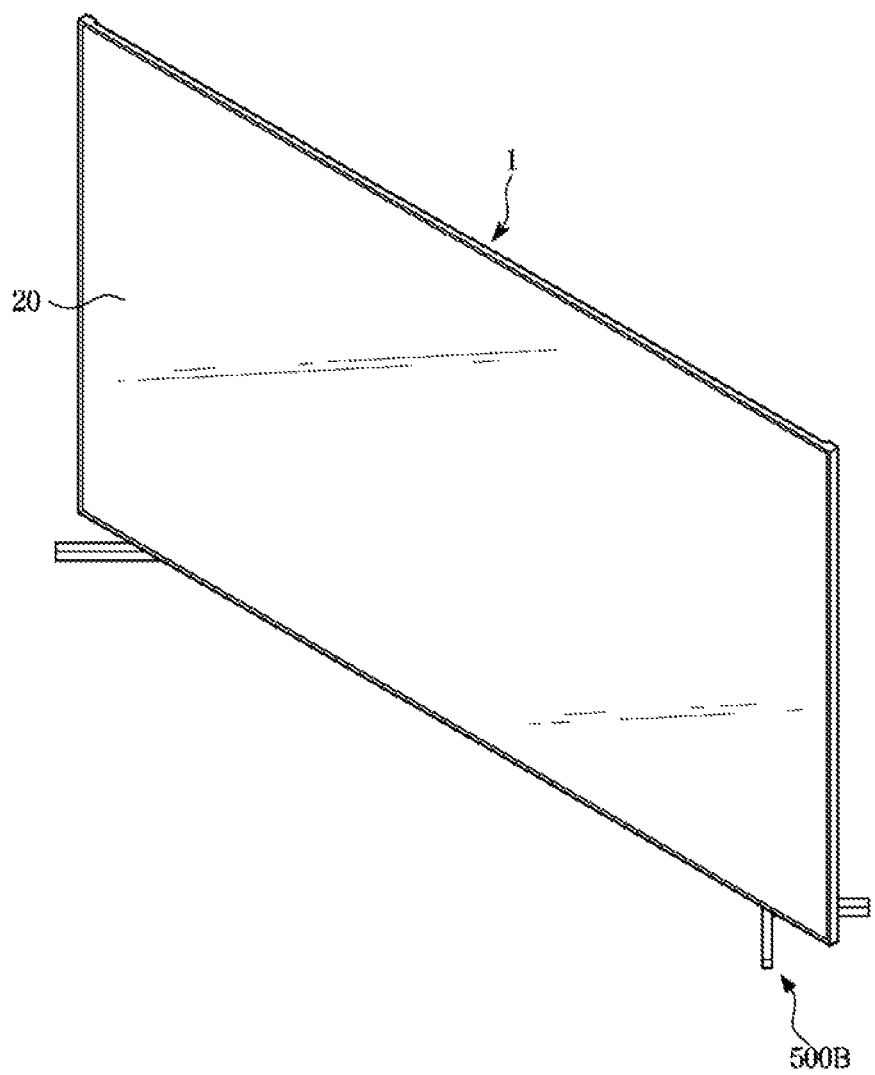
Figure 20A:
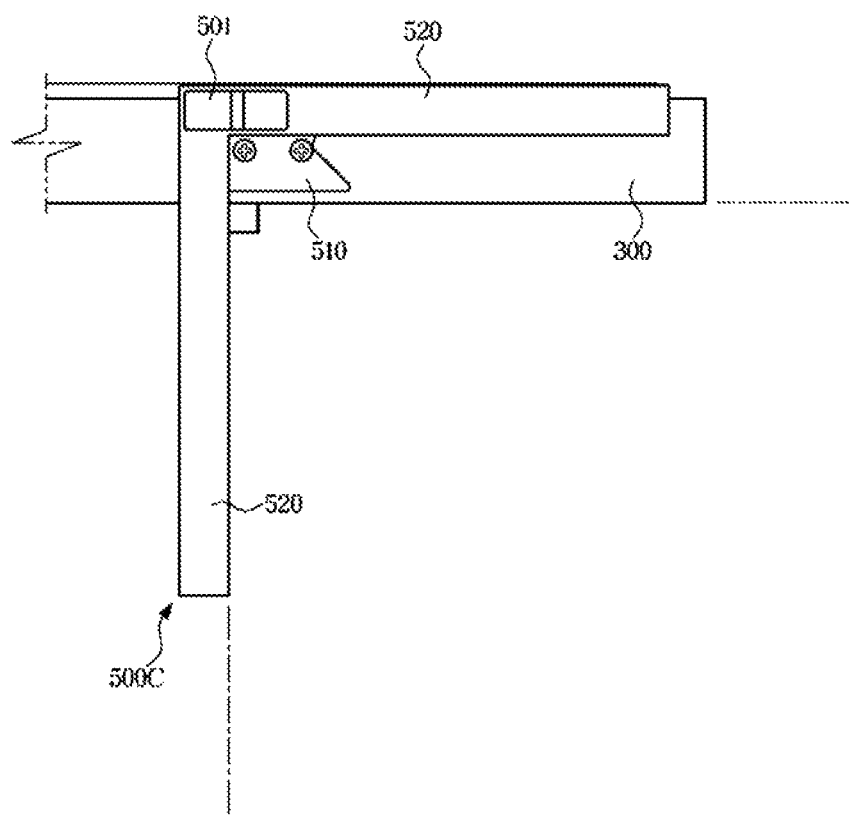
FIGS. 20A and 20B show a state in which the stand member of the display apparatus according to the modified example of the second embodiment of the disclosure is coupled in a second type.
Figure 20B:
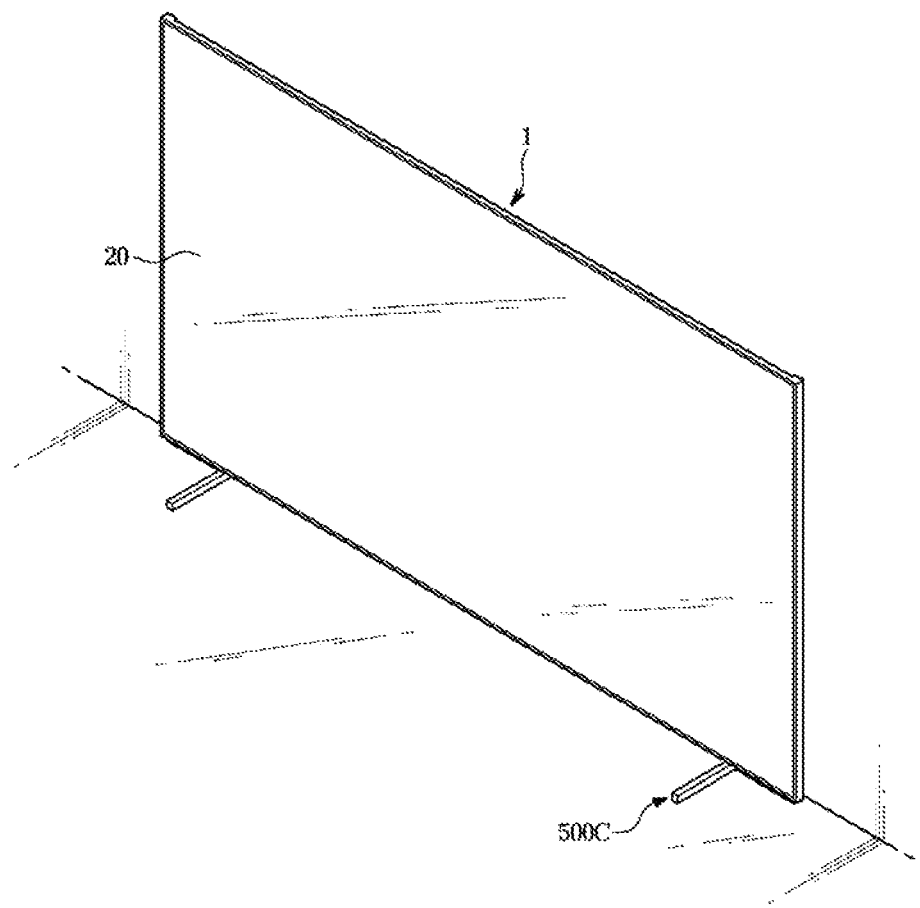

FIG. 15 is a rear view of a display apparatus according to a modified example of the second embodiment of the disclosure, FIGS. 16A and 16B show a state in which a stand member of the display apparatus according to the modified example of the second embodiment of the disclosure is taken out of an accommodating portion, FIG. 17 shows a state in which the stand member of the display apparatus according to the modified example of the second embodiment of the disclosure is assembled into the display apparatus, FIG. 18 shows a coupling portion of the display apparatus according to the modified example of the second embodiment of the disclosure, FIGS. 19A and 19B show a state in which the stand member of the display apparatus according to the modified example of the second embodiment of the disclosure is coupled in a first type, and FIGS. 20A and 20B show a state in which the stand member of the display apparatus according to the modified example of the second embodiment of the disclosure is coupled in a second type.

A pair of stand members 500R and 500L may be accommodating in both end portions of the cable guide 320. Hereinafter, one stand member 500 of the pair of stand members 500R and 500L will be described.

The stand member 500 may include a support area 520 supporting the display apparatus 1, and a coupling bracket 510 coupled with a coupling portion 340', upon coupling of the stand member 500 with the coupling portion 340'.

The support area 520 may be bent to a substantially right angle. At a bent portion of the support area 520, the coupling bracket 510 may be formed.

An accommodating portion 330' may extend in the left-right direction of the display apparatus 1 from an end of the cable guide 320, and, at a side edge of the display apparatus 1, the accommodating portion 330' may extend to be orthogonal to an extension direction of the left-right direction.

That is, the accommodating portion 330' may form a bent space corresponding to a shape of the support area 520.

Accordingly, a portion of the support area 520 may be accommodated in the accommodating portion 330' in a direction corresponding to the extension direction of the cable guide 320, and the other portion of the support area 520 bent from the portion of the support area 520 may be accommodated in the accommodating portion 330' in a position that the other portion of the support area 520 is disposed parallel to the side edge of the display apparatus 1.

The accommodating portion 330' may include an extension space 330a' extending in the direction of the side edge of the display apparatus 1 in a space where the other portion of the support area 520 bent from the portion of the support area 520 is accommodated.

Accordingly, the stand member 500 may be accommodated in the accommodating portion 330' in such a way to be movable in the left-right direction by a width in left-right direction of the extension space 330a' inside the accommodating portion 330'.

This may be aimed to easily accommodate the coupling bracket 510 of the stand member 500 in the accommodating portion 330'.

In the case in which the accommodating portion 330' is in a shape corresponding to the support area 520 of the stand member 500 without having the extension space 330a', the coupling bracket 510 may interfere with accommodation of the stand member 500 into the accommodating portion 330'.

To take the stand member 500 out at an accommodated location 500A at which the stand member 500 is accommodated in the accommodating portion 330', a user may move the stand member 500 to the extension space 330a'.

At one side of the support area 520, a handle portion 501 for enabling a user to grip the stand member 500 may be provided. The user may grip the handle portion 501 to move the stand member 500 to the extension space 330a'.

Also, the user may move the stand member 500 to the extension space 330a' through the space A formed by the inclined portion 321.

In the case in which the stand member 500 is positioned at the accommodated location 500A, the coupling bracket 510 may be accommodated in a bracket accommodating area 330b' formed inside the accommodating portion 330'. The coupling bracket 510 may be accommodated in the bracket accommodating area 330b' to support the stand member 500 such that the stand member 500 is stably accommodated in the accommodating portion 330'.

However, although the coupling bracket 510 is not accommodated in the bracket accommodating area 330b' and supported, the stand member 500 may be stably supported in the accommodating portion 330' because a portion of the support area 520 is supported in the accommodating portion 330' in the left-right direction.

After the stand member 500 moves to the extension space 330a', the coupling bracket 510 may be taken out of the bracket accommodating area 330b', and the stand member 500 may be taken out in a rear direction from the rear cover 300'.

Then, the coupling bracket 510 of the stand member 500 may be coupled with the coupling portion 340' formed in the lower side of the rear cover 300 through coupling of the screw S.

After the coupling portion 340' is in contact with the coupling bracket 510, the coupling portion 340' may be coupled with the coupling bracket 510 so that the stand member 500 may be coupled with the rear cover 300'.

The coupling portion 340' may include a plurality of stand coupling grooves 341. The plurality of stand coupling grooves 341 may include a first stand coupling groove 341a and a second stand coupling groove 341b aligned in the left-right direction of the display apparatus 1, and a third stand coupling groove 341c positioned in a diagonal direction with respect to the second stand coupling groove 341b.

The third stand coupling groove 341c may be formed in the diagonal direction with respect to the second stand coupling groove 341b to be at a preset angle θ with respect to the second stand coupling groove 341b.

The coupling bracket 510 may include a pair of screw coupling holes 511 aligned in the extension direction of the support area 520 to be screw-coupled with at least two coupling grooves of the plurality of stand coupling grooves 341.

The pair of screw coupling holes 511 may be screw-coupled with the first stand coupling groove 341a and the second stand groove 341b or with the first stand coupling groove 341a and the third stand coupling groove 341c.

In the case in which the pair of screw coupling holes 511 are coupled with the first stand coupling groove 341a and the second stand coupling groove 341b, the stand member 500 may support the display apparatus 1 at a coupling location 500B of a first type.

In the case in which the stand member 500 is positioned at the coupling location 500B of the first type, at least one portion of the support area 520 may be positioned in a diagonal direction to be at a preset angle θ with respect to the left-right direction of the display apparatus 1.

In the case in which at least one portion of the support area 520 being bent is positioned in the front direction from the display apparatus 1 while being at a preset angle θ in a diagonal direction with respect to the display apparatus 1, the other portion of the support area 520 may be positioned in the rear direction from the display apparatus 1.

In the case in which the stand member 500 is positioned at the coupling location 500B of the first type, the support area 520 may be positioned in the front and rear directions from the display apparatus 1 so that the stand member 500 may stably support the display apparatus 1.

At least one side of the coupling bracket 510 may meet another side of the coupling bracket 510 with a preset angle θ in a diagonal direction.

Accordingly, although the stand member 500 is positioned at the coupling location 500B of the first type, the coupling bracket 510 may not protrude to the outside of a rear side surface of the rear cover 300', which improves an aesthetic sense.

In the case in which the pair of screw coupling holes 511 are coupled with the first stand coupling groove 341a and the third stand coupling groove 341c, the stand member 500 may support the display apparatus 1 at a coupling location 500C of a second type.

In this case, at least one portion of the support area 520 may be coupled with the coupling portion 340' such that a longitudinal direction of the at least one portion is positioned in a direction corresponding to the left-right direction of the display apparatus 1, and the other portion of the support area 520 may be coupled with the coupling portion 340' such that a longitudinal direction of the other portion is positioned in a direction being orthogonal to the left-right direction of the display apparatus 1.

In the case in which the stand member 500 supports the display apparatus 1 at the coupling location 500C of the second type, the other portion of the support area 520 may be positioned in the front direction from the display apparatus 1.

In the case in which the other portion of the support area 520 is positioned in the front direction from the display apparatus 1, at least one portion of the support area 520 may be incapable of supporting a rear side of the display apparatus 1 because an extension direction of the at least one portion is the left-right direction of the display apparatus 1.

Accordingly, in the case in which the stand member 500 supports the display apparatus 1 at the coupling location 500C of the second type, the display apparatus 1 may be supported through the rear cover 300' supported by a wall or a certain component located behind the display apparatus 1.

According to an example of a wall, in the case in which the stand member 500 is positioned at the coupling location 500B of the first type, the other portion of the support area 520 may be positioned in the rear direction from the display apparatus 1 so that the rear cover 300' of the display apparatus 1 is incapable of being supported by a wall located behind the display apparatus 1, whereas, in the case in which the stand member 500 supports the display apparatus 1 at the coupling location 500C of the second type, the display apparatus 1 may be positioned adjacent to the wall because the support area 520 is not positioned behind the display apparatus 1, and the rear cover 300' may be supported by the wall.

The at least one portion may be positioned in a diagonal direction with respect to the display apparatus 1, while being at a preset angle θ with respect to the left-right direction of the display apparatus 1.

Hereinafter, a third embodiment of the disclosure will be described. Other components except for those described below are the same as the corresponding ones described above in the second embodiment of the disclosure, and therefore, detailed descriptions thereof will be omitted.

Figure 21:
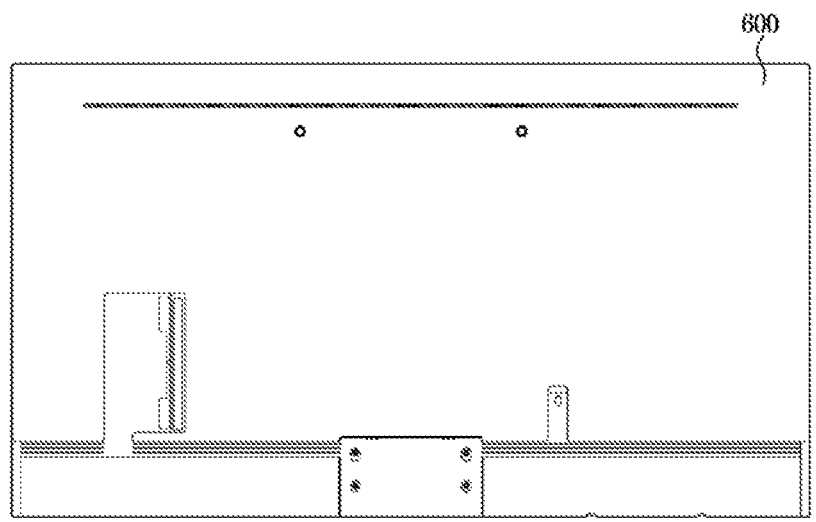
FIG. 21 is a rear view of a display apparatus according to a third embodiment of the disclosure.
Figure 22A:
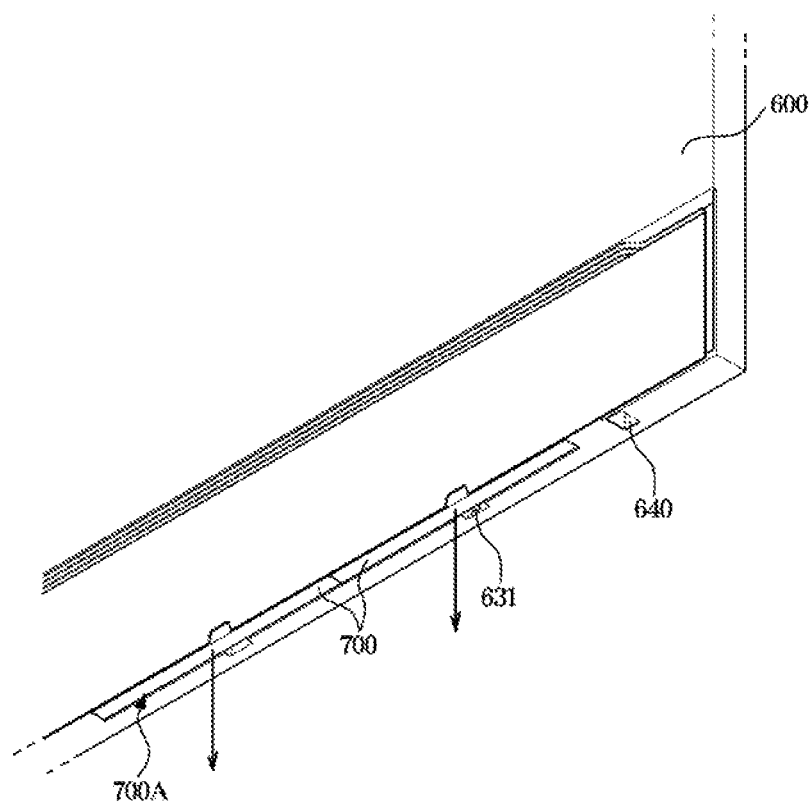
FIGS. 22A and 22B show a state in which a stand member of the display apparatus according to the third embodiment of the disclosure is taken out of an accommodating portion.
Figure 22B:
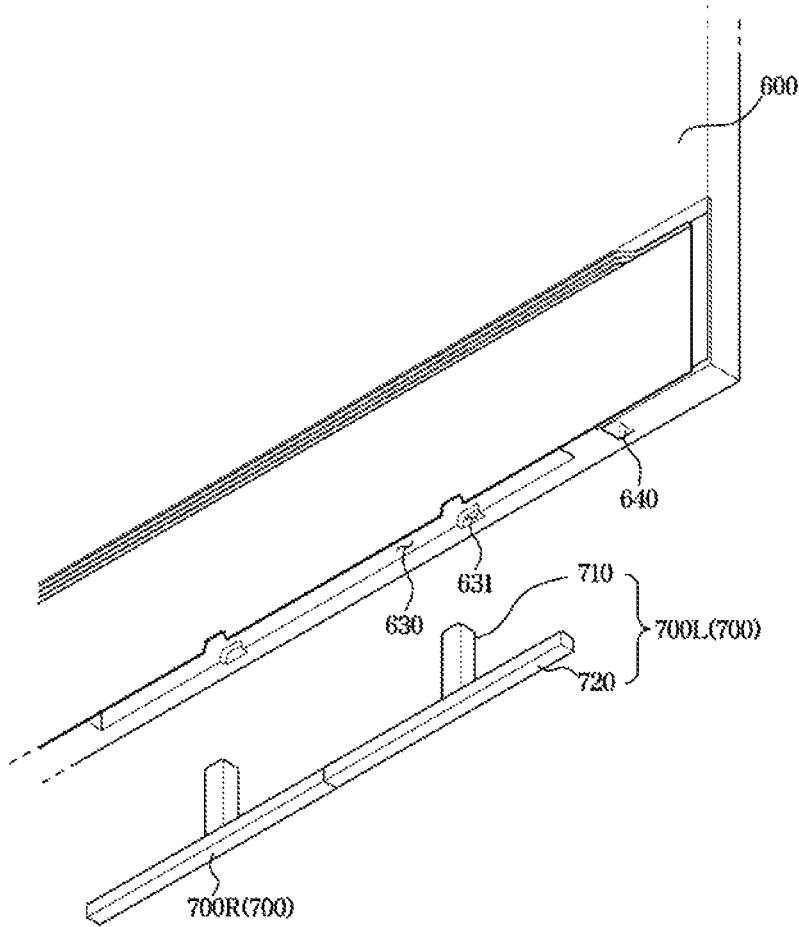
Figure 23:
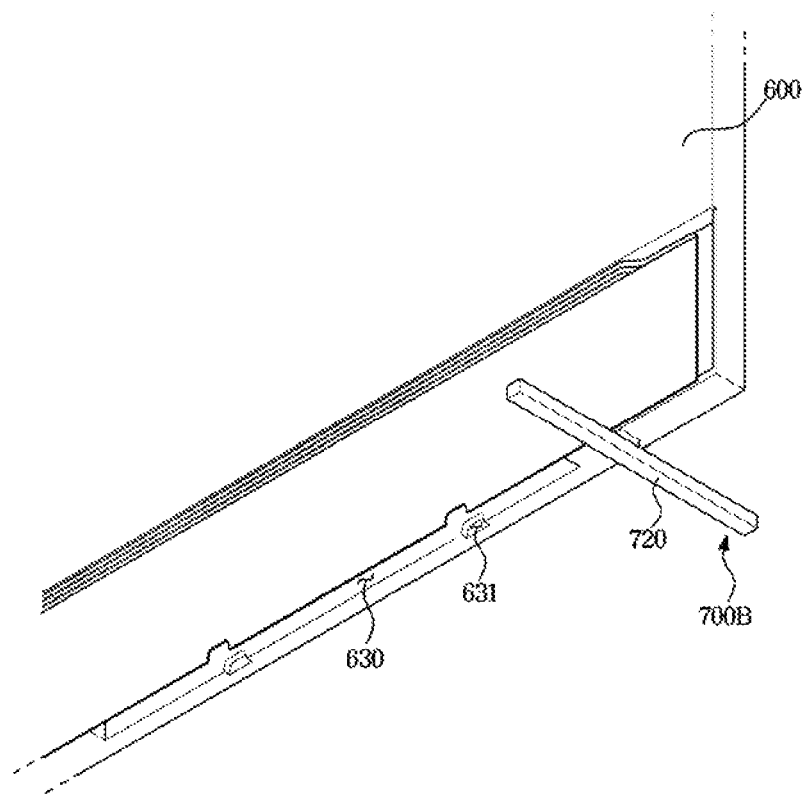
FIG. 23 shows a state in which the stand member of the display apparatus according to the third embodiment of the disclosure is assembled into the display apparatus.

FIG. 21 is a rear view of a display apparatus according to a third embodiment of the disclosure, FIGS. 22A and 22B show a state in which a stand member of the display apparatus according to the third embodiment of the disclosure is taken out of an accommodating portion, and FIG. 23 shows a state in which the stand member of the display apparatus according to the third embodiment of the disclosure is assembled into the display apparatus.

A stand member 700 may be accommodated in an accommodating portion 630 positioned in a lower side surface of the rear cover 600. The stand member 700 may be accommodated in the accommodating portion 630 in the up-down direction of the display apparatus 1, and also taken out of the accommodating portion 630 in the up-down direction of the display apparatus 1.

The accommodating portion 630 may include a handle area 631 for enabling a user to easily grip the stand member 700 positioned at an accommodated location 700A. The user may easily grip the stand member 700 through the handle area 631 and press the stand member 700 downward to take the stand member 700 out of the accommodating portion 630.

The stand member 700 may include an inserting protrusion 710 to be inserted into a coupling portion 640, and a support area 720 extending from the inserting protrusion 710. The inserting protrusion 710 may be orthogonal to the support area 720.

The stand member 700 may be accommodated in the accommodating portion 630 by forced-inserting to prevent the stand member 700 from escaping from the accommodating portion 630.

In the case in which the stand member 700 is positioned at the accommodated location 700A at which the stand member 700 is accommodated in the accommodating portion 630, the stand member 700 may be additionally screw-coupled with the rear cover 600 to be stably supported in the accommodating portion 630, which is not shown in the drawings.

The stand member 700 may be, after being taken out, inserted into the coupling portion 640 formed in the lower side of the rear cover 600. More particularly, the inserting protrusion 710 may be inserted into the coupling portion 640.

In the case in which the inserting protrusion 710 is inserted into the coupling portion 640, the stand member 700 may be positioned at a coupled location 700B at which the stand member 700 is coupled with the rear cover 600, and accordingly, the stand member 700 may stably support the display apparatus 1.

A pair of coupling portions 640 may be provided adjacent to both side edges of the display apparatus 1, although not shown in the drawings. Accordingly, a pair of stand members 700 may be provided and coupled with the pair of coupling portions 640, respectively. Also, a plurality of coupling portions 640 may be provided in pairs to be adjacent to both side edges of the display apparatus 1.

In the case in which the stand member 700 is positioned at the accommodated location 700A, an extension direction of the support area 720 may be a direction corresponding to the left-right direction of the display apparatus 1, and in the case in which the stand member 700 is positioned at the coupled location 700B, an extension direction of the support area 720 may be a direction corresponding to the front-back direction of the display apparatus 1.

That is, a position of the support area 720 of the stand member 700 at the accommodated location 700A may be orthogonal to a position of the support area 720 of the stand member 700 at the coupled location 700B.

According to the disclosure, because the stand for holding the display apparatus is accommodated in the display apparatus in the case in which the display apparatus is mounted on a wall, and, in the case in which the display apparatus stands on a floor, the stand is taken out of the display apparatus and assembled into the display apparatus to hold the display apparatus thereon, the stand may be prevented from being lost, without having to be stored separately.

Also, according to the disclosure, because the stand is accommodated inside the display apparatus without being exposed to outside in the case in which the display apparatus is mounted on a wall, an aesthetic sense may be improved.

Although a few embodiments of the disclosure have been shown and described, it would be appreciated by those skilled in the art that changes may be made in these embodiments without departing from the principles and spirit of the disclosure, the scope of which is defined in the claims and their equivalents.

What is claimed is:
1. A display apparatus comprising:
 a display panel configured to display an image in a front direction;
 a top chassis positioned in a front direction of the display panel;
 a bottom chassis positioned in a rear direction of the display panel;
 a rear cover covering a rear side of the bottom chassis and including screw holes formed on a rear surface of the rear cover;

a stand member being accommodatable on the rear cover and selectively coupled with the rear surface of the rear cover, wherein the rear cover comprises an accommodating portion in which the stand member is accommodated and a coupling portion which is coupled with the stand member, and the stand member comprises an inserting protrusion which is inserted into the accommodating portion and the coupling portion, wherein the inserting protrusion is insertable into the accommodating portion in a vertical direction of the display apparatus and into the coupling portion in a front-back direction of the display apparatus, wherein the inserting protrusion includes a screw coupling hole, and the inserting protrusion is couplable to the accommodating portion by a screw passing through the screw coupling hole and a corresponding screw hole in the front-back direction of the display apparatus.

2. The display apparatus according to claim 1, wherein the inserting protrusion comprises:
- a body portion which is inserted into the accommodating portion or the coupling portion;
- a support portion formed at one portion of the body portion and supporting at least one portion of the coupling portion upon insertion of the body portion into the coupling portion; and
- a hook extending in the vertical direction of the display apparatus from one end of the support portion.

3. The display apparatus according to claim 2, wherein the inserting protrusion further comprises a screw hole formed in the body portion and screw-coupled with the accommodating portion upon insertion of the body portion into the accommodating portion.

4. The display apparatus according to claim 1, wherein the stand member comprises a coupling area in which the inserting protrusion is formed and which contacts the rear cover upon coupling of the stand member with the coupling portion, a support area supporting the display apparatus upon coupling of the stand member with the coupling portion, and a connection area connecting the coupling area to the support area, and
the coupling area is orthogonal to the support area.

5. The display apparatus according to claim 4, wherein the connection area extends from the support area to be inclined at a preset angle with respect to the support area.

6. The display apparatus according to claim 4, wherein the coupling area further comprises a screw coupling hole through which the stand member is additionally screw-coupled with the rear cover upon coupling of the stand member with the coupling portion.

7. The display apparatus according to claim 4, wherein the stand member is provided as a pair of stand members respectively positioned adjacent to left and right edges of the display apparatus,
the display apparatus further comprises a connection member connecting the pair of stand members to each other, and
each of the pair of stand members comprises a support portion including a supplementary coupling portion coupled with the connection member.

8. The display apparatus according to claim 1, wherein the accommodating portion is provided in a shape of a groove corresponding to the stand member to accommodate the stand member.

9. The display apparatus according to claim 8, wherein a width in the vertical direction of the accommodating portion is greater than a width in the vertical direction of the stand member, and the stand member is movable in the vertical direction inside the accommodating portion.

10. The display apparatus according to claim 8, wherein the accommodating portion further comprises an inserting groove into which the inserting protrusion is inserted and which is concave in the vertical direction of the display apparatus.

11. The display apparatus according to claim 1, wherein the coupling portion comprises a plurality of stand coupling grooves into which the inserting protrusion is inserted, and
the plurality of stand coupling grooves are spaced in the vertical direction of the display apparatus to enable the inserting protrusion to be inserted into one of the plurality of stand coupling grooves selectively in the vertical direction of the display apparatus.

12. The display apparatus according to claim 1, further comprising an electronic component configured to control the display panel,
wherein the rear cover further comprises a cable guide being in a shape of a groove extending in a left-right direction to guide a location of a cable for transferring a signal to the electronic component from outside, and
the accommodating portion is formed at an end of the cable guide.

13. The display apparatus according to claim 12, wherein the coupling portion is positioned at a lower end of the rear cover, and
the inserting protrusion is inserted into the coupling portion in the vertical direction of the display apparatus.

14. The display apparatus according to claim 1, wherein the accommodating portion and the coupling portion are positioned at a rear end of the rear cover, and
a position of the stand member accommodated in the accommodating portion is orthogonal to a position of the stand member coupled with the coupling portion.

* * * * *